(12) United States Patent
Arita et al.

(10) Patent No.: US 8,236,427 B2
(45) Date of Patent: Aug. 7, 2012

(54) MOISTUREPROOF CELLULOSE ESTER FILM, POLARIZER-PROTECTIVE FILM, AND POLARIZER

(75) Inventors: Hiroaki Arita, Fuchu (JP); Kazuhiro Fukuda, Hachioji (JP); Koji Ozaki, Hino (JP); Issei Suzuki, Hachioji (JP)

(73) Assignee: Konica Minolta Holdings, Inc., Tokyo (JP)

( * ) Notice: Subject to any disclaimer, the term of this patent is extended or adjusted under 35 U.S.C. 154(b) by 934 days.

(21) Appl. No.: 12/087,174

(22) PCT Filed: Dec. 27, 2006

(86) PCT No.: PCT/JP2006/326053
§ 371 (c)(1),
(2), (4) Date: Jun. 27, 2008

(87) PCT Pub. No.: WO2007/077871
PCT Pub. Date: Jul. 12, 2007

(65) Prior Publication Data
US 2009/0053496 A1 Feb. 26, 2009

(30) Foreign Application Priority Data
Jan. 6, 2006 (JP) .................. 2006-001262

(51) Int. Cl.
*B32B 19/04* (2006.01)
*B32B 27/32* (2006.01)
*G11B 5/64* (2006.01)
(52) U.S. Cl. .................. 428/445; 428/220; 428/336
(58) Field of Classification Search .................. 428/445, 428/220, 336
See application file for complete search history.

(56) References Cited

U.S. PATENT DOCUMENTS

| 5,976,297 A | 11/1999 | Oka et al. |
| 7,488,683 B2 * | 2/2009 | Kobayashi et al. ........... 438/681 |
| 2002/0192397 A1 | 12/2002 | Tsujimoto |
| 2006/0264044 A1 | 11/2006 | Kobayashi et al. |

FOREIGN PATENT DOCUMENTS

| EP | 1237017 A1 | 9/2002 |
| JP | 07-056017 A | 3/1995 |
| JP | 07056017 A * | 3/1995 |
| JP | 2002-301788 A | 10/2002 |
| JP | 2003-221465 A | 8/2003 |

(Continued)

*Primary Examiner* — Michael M Bernshteyn
(74) *Attorney, Agent, or Firm* — Holtz, Holtz, Goodman & Chick, PC

(57) ABSTRACT

A moistureproof cellulose ester film which has satisfactory optical performances, excellent moisture permeability, and excellent dimensional stability; and a protective film for polarizers which comprises the film. This moistureproof cellulose ester film comprises: a cellulose ester film and, deposited on at least one side thereof in the following order, one or more adhesion layers each having a carbon content in terms of atom number concentration of 1-40% and comprising an inorganic compound as the main component, one or more barrier layers each having a carbon content in terms of atom number concentration of 0.1% or lower, comprising silicon oxide as the main component, and having a film density of 2.16-2.60, and one or more protective layers each having a carbon content in terms of atom number concentration of 1-40% and comprising an inorganic compound as the main component. The total thickness of these deposit layers on one side is 1-100 nm. It is characterized in that the barrier layers on one side have a thickness of 0.1-30 nm.

16 Claims, 2 Drawing Sheets

FOREIGN PATENT DOCUMENTS

| | | | |
|---|---|---|---|
| JP | 2003-232930 A | | 8/2003 |
| JP | 2003232930 A | * | 8/2003 |
| JP | 2005089859 A | * | 4/2005 |
| JP | 2005-200737 A | | 7/2005 |
| JP | 2005200737 A | * | 7/2005 |
| JP | 2005306924 A | | 11/2005 |
| WO | WO 2005/116293 A1 | | 12/2005 |

* cited by examiner

US 8,236,427 B2

MOISTUREPROOF CELLULOSE ESTER FILM, POLARIZER-PROTECTIVE FILM, AND POLARIZER

This application is the United States national phase application of International Application PCT/JP2006/326053 filed Dec. 27, 2006.

FIELD OF THE INVENTION

The present invention relates to a cellulose ester film of excellent moisture resistance, as well as a polarizer protective film and a polarizer using the same.

BACKGROUND OF THE INVENTION

In recent years, development has progressed to decrease the thickness and weight of laptop personal computers. Along with the above, a decrease in thickness has increasingly been demanded for polarizers employed in liquid crystal display devices. Specifically, in order to decrease the thickness of polarizers, a decrease in thickness of a polarizer protective film has increasingly been sought. However, it has become clear that when only the thickness of polarizing plate protective films is decreased, various drawbacks result.

As one of them, polarizers are adversely affected by moisture permeability (being moisture transmittance). For example, along with a decrease in thickness of the polarizer protective film, moisture transmittance increases. As a result, durability of the polarizer is degraded. In order to improve the above moisture transmittance, various methods are proposed. It is assured that as the moisture transmittance decreases, durability of the resulting polarizer is enhanced. On the other hand, a drawback has been found in which during adhesion of a polarizer protective film to a polarizer, adhesive agents are not sufficiently dried due to its low moisture permeability.

Therefore, a polarizer protective film is required to exhibit targeted moisture permeation characteristics to satisfy both. Specifically, the moisture transmittance of the polarizer protective films, incorporating cellulose ester, which are now commonly employed, is markedly increased due to a decrease in film thickness.

In view of the foregoing, developments of a cellulose ester film which is provided with physical properties such as desired moisture permeability and high dimensional stability and a polarizer protective film using the same are highly sought. For example, a technology is disclosed in which moisture transmittance is lowered by the addition of plasticizers into a cellulose ester dope (refer, for example, to Patent Document 1). However, with only the addition of plasticizers, it is difficult to realize the targeted moisture transmittance. Further, a technology is disclosed in which a resin layer is provided on a cellulose ester film (refer, for example, to Patent Document 2). However, in order to achieve high water vapor barring performance, a relatively thick film is typically needed and its application to a polarizer protective film is not preferred.

Patent Document 1: Japanese Patent Publication Open to Public Inspection (hereinafter referred to as JP-A) No. 2003-221465

Patent Document 2: JP-A No. 2002-301788

DISCLOSURE OF THE INVENTION

Problems to be Solved by the Invention

In view of the foregoing, the present invention was achieved. An object of the present invention is to provide a moisture-proof cellulose ester film which exhibits excellent optical properties, desired moisture transmittance, and excellent dimensional stability, as well as a polarizer protective film, and a polarizer using the same.

Means to Solve the Problems

An object of the present invention described above has been achieved by the following constitutions.

1. A moisture-proof cellulose ester film comprising a cellulose ester film and deposited at least one side thereof in the following order, one or more adhesion layer each having a carbon content in terms of atom number concentration of 1-40% and comprising an inorganic compound as a main component, one or more barrier layer each having a carbon content in terms of atom number concentration of 0.1% or lower, comprising silicon oxide as a main component, and having a film density of 2.16-2.60, and one or more protective layer each having a carbon content in terms of atom number concentration of 1-40% and comprising an inorganic compound as a main component, wherein the barrier layer on one side of the cellulose film has a thickness of 0.1-30 nm.

2. The moisture-proof cellulose ester film of item 1, having a degree of the moisture permeation of 0.01-50 g/m$^2$/day.

3. The moisture-proof cellulose ester film of item 1 or item 2, wherein the barrier layer is provided by a thin film forming method on the cellulose ester film, the method comprising: supplying gas comprising thin layer forming gas and discharging gas in discharge space under the pressure of atmosphere or its neighbors, exciting the gas by supplying a high frequency electric field in the discharge space, and exposing the cellulose film to the excited gas.

4. The moisture-proof cellulose ester film of item 3, wherein the discharging gas is a nitrogen gas, a first high frequency electric field is overlapped with a second high frequency electric field which is applied on the discharge space, a frequency $\omega 2$ of the second high frequency electric field is higher than a frequency $\omega 1$ of the first high frequency electric field, a relation among a strength of the first high frequency electric field V1, a strength of the second high frequency electric field V2 and a strength of electric field starting discharge IV satisfies V1≧IV>V2 or V1>IV≧V2, and an output density of the second high frequency electric field is more than 1 W/cm$^2$.

5. The moisture-proof cellulose ester film of any one of items 1-4, wherein the adhesion layer has a silicon oxide as a main component and a density of the adhesion layer of 1.7-2.0.

6. The moistureproof cellulose ester film of any one of items 1-5, wherein the adhesion layer is provided by a thin film forming method on the cellulose ester film, the method comprising: supplying gas comprising thin layer forming gas and discharging gas in discharge space under the pressure of atmosphere or its neighbors, exciting the gas by supplying a high frequency electric field in the discharge space, and exposing the cellulose film to the excited gas.

7. The moisture-proof cellulose ester film of item 6, wherein the discharging gas is a nitrogen gas, a first high frequency electric field is overlapped with a second high frequency electric field which is applied on the discharge space, a frequency ω2 of the second high frequency electric field is higher than a frequency ω1 of the first high frequency electric field, a relation among a strength of the first high frequency electric field V1, a strength of the second high frequency electric field V2 and a strength of electric field starting discharge IV satisfies V1≧IV>V2 or V1>IV≧V2, and an output density of the second high frequency electric field is more than 1 W/cm².

8. The moisture-proof cellulose ester film of any one of items 1-7, wherein the protective layer has a silicon oxide as a main component and a density of the protective layer of 1.7-2.0.

9. The moisture-proof cellulose ester film of any one of items 1-8, wherein the protective layer is provided by a thin film forming method on the cellulose ester film, the method comprising: supplying gas comprising thin layer forming gas and discharging gas in discharge space under the pressure of atmosphere or its neighbors, exciting the gas by supplying a high frequency electric field in the discharge space, and exposing the cellulose film to the excited gas.

10. The moisture-proof cellulose ester film of item 9, wherein the discharging gas is a nitrogen gas, a first high frequency electric field is overlapped with a second high frequency electric field which is applied on the discharge space, a frequency ω2 of the second high frequency electric field is higher than a frequency ω1 of the first high frequency electric field, a relation among a strength of the first high frequency electric field V1, a strength of the second high frequency electric field V2 and a strength of electric field starting discharge IV satisfies V1≧IV>V2 or V1>IV≧V2, and an output density of the second high frequency electric field is more than 1 W/cm².

11. The moisture-proof cellulose ester film of any one of items 1-10, wherein the barrier layer on one side of the cellulose film has a thickness of 0.1-5.0 nm and a degree of the moisture permeation of 0.1-50 g/m²/day.

12. The moisture-proof cellulose ester film of any one of items 1-11, wherein the total thickness of the layers on one side of the cellulose film is 1-100 nm.

13. The moisture-proof cellulose ester film of any one of items 1-12, comprising the adhesion layer, the barrier layer and the protective layer on the both side of the cellulose film.

14. A protective film for polarizer comprising the moisture-proof cellulose ester film of items 13.

15. A polarizer comprising the protective film for polarizer of item 14.

Embodiments

According to the present invention, it has become possible to provide a moisture-proof cellulose ester film which exhibits excellent optical performance, desired moisture transmittance, and excellent dimensional stability, as well as a polarizer protective film and a polarizer using the same.

DESCRIPTION OF THE ALPHANUMERIC DESIGNATIONS

Figure 1:
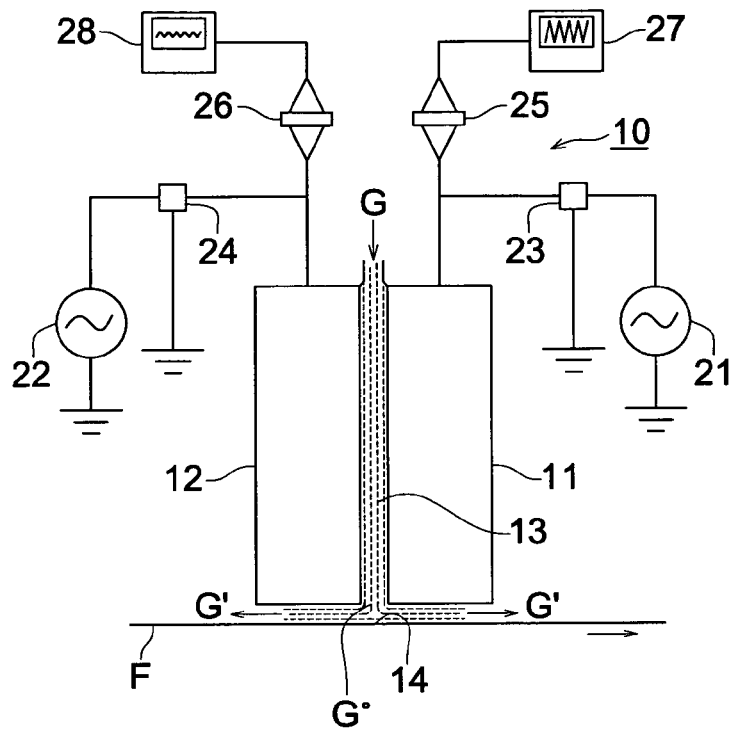
FIG. 1 is a schematic view showing one example of a jet system atmospheric pressure plasma discharge processing apparatus which is useful for the present invention.

| | |
|---|---|
| 10 | plasma discharge processing apparatus |
| 11 | first electrode |
| 12 | second electrode |
| 21 | first power source |
| 30 | plasma discharge processing apparatus |
| 32 | discharge space |
| 35 | rotary roller electrode |
| 35a | roller electrode |
| 35A | metallic host material |
| 35B | dielectric |
| 36 | a group of squared cylindrical fixed electrodes |
| 40 | electric field applying means |
| 41 | first power source |
| 42 | second power source |
| 50 | gas feeding means |
| 51 | gas generating apparatus |
| 52 | gas inlet |
| 53 | exhaust outlet |
| 60 | electrode temperature regulating means |
| G | thin film forming gas |
| G° | plasma state gas |
| G' | processing exhaust gas |

BEST MODE FOR PRACTICING THE INVENTION

An optimal embodiment to practice the present invention will now be detailed.

In view of the foregoing, the inventors of the present invention conducted diligent investigations. As a result, the following was discovered, and the present invention was achieved. By employing a moisture-proof cellulose ester film which was prepared to characterize in having, on at least one side of a cellulose ester film as a substrate, in the stated order, at least one of each of a adhesion layer at a carbon content ratio of 1-40% in terms of atomic concentration, which was composed of inorganic compounds as a main component, a barrier layer at a film density of 2.16-2.60 and a carbon content of at most 0.1% in terms of atomic concentration, which was composed of silicon oxide as a main component, and the protective layer at a carbon content ratio of 1-40%, which was composed of inorganic compounds as a main component, it was possible to realize a cellulose ester film which exhibited excellent optical properties, desired moisture transmittance, and excellent dimensional stability, as well as a polarizer protective film, and a polarizer employing the same.

The present invention will now be detailed.

<<Moisture-proof Cellulose Ester Film>>

One of the features of the moisture-proof cellulose ester film of the present invention is that it is prepared as follows. On at least one side of a cellulose ester film as a substrate, formed in the stated order, at least one of each of a adhesion layer at a carbon content ratio of 1-40% in terms of atomic concentration, which is composed of inorganic compounds as a main component, a barrier layer at a film density of 2.16-2.60 and a carbon content of at most 0.1% in terms of atomic concentration, which is composed of silicon oxide as a main component, and a protective layer at a carbon content ratio of 1-40%, which is composed of inorganic compounds as a main component.

Initially, definition of each of the characteristic values which specify the moisture-proof cellulose ester film of the present invention and measurement methods will be described.

One of the features of the present invention is that the adhesion layer is composed of inorganic compounds as a main component while the barrier layer is composed of silicon oxide as a main component. "Main component", as described in the present invention, means that the content of the aforesaid compound is at least 60% by weight in each layer. Further, inorganic compounds according to the present invention include metal carbides, metal nitrides, metal oxides, metal sulfides, and metal halides, as well as mixtures thereof (such as metal oxide nitrides, metal oxide halides, and metal nitride carbides). Of these, preferred are the metal oxides, metal oxide nitrides, and the metal nitrides. Specifically preferred examples thereof include silicon oxide, aluminum oxide, silicon oxide nitride, aluminum oxide nitride, magnesium oxide, zinc oxide, indium oxide, and tin oxide. Of these, specifically preferred is the silicon oxide.

It is possible to determine the carbon content ratio (being atomic concentration) of each of the constituting layers according to the present invention via the following method.

"Carbon content amount", as described in the present invention refers to atomic concentration in %, which can be determined via conventional analytical means. In the present invention, it is calculated based on the following XPS method, and defined as follows.

Atomic concentration in %=number of carbon atoms/number of total atoms×100.

In the present invention, employed as an XPS surface analytical instrument was ESCALAB-200R, produced by VG Scientifics Co., Ltd. In practice, measurements are performed at an output of 600 W (an acceleration voltage of 15 kV and an emission electric current of 40 mA), employing Mg as an X-ray anode. Energy resolution is set to result in 1.5-1.7 eV when specified by the half value width of a clean Ag3d5/2 peak.

Upon measurement, initially, a range of bond energy of 0-1,100 eV is measured at data downloading intervals of 1.0 eV, and any of the detected elements is obtained.

Subsequently, with regard to all detected atoms except for etching ion species, slow scanning is performed to the photoelectron peak which provides the maximum intensity at data downloading intervals of 0.2 eV, whereby spectra of each element are determined.

In order to minimize difference in the computed results of the content ratio, due to measuring instruments or computers, the obtained spectra are transferred to COMMON DATA PROCESSING SYSTEM (Ver. 2.3 or the following is preferred), produced by VAMAS-SCA-JAPAN, and subsequently are processed via the software thereof. The content ratio value of each of the analysis targeted elements (such as carbon, oxygen, silicon, and titanium) is obtained as atomic concentration (in %).

Prior to performing quantitative processing, each element is subjected to calibration of "Count Scale" to result in a 5-point smoothing processing. In the above quantitative processing, peak area intensity (cps*eV), in which background has been removed, is employed. Background processing is performed via the Shirley method. Further, the Shirley method may be referred to at D. A. Shirley, Phys. Rev., B5, 4709 (1972).

Further, one of the features of the moisture-proof cellulose ester film of the present invention is that the film density of the barrier layer is in the range of 2.16-2.60, and the film density of the adhesion layer and the protective layer is in the range of 1.7-2.0.

It is possible to determine the film density of each layer specified by the present invention via conventional analytical means. In the present invention, employed are values obtained by an X-ray reflectivity method.

The X-ray reflectivity method may be carried out referring to the outline described on page 151 of X Sen Kaiseki Handbook (X-Ray Diffraction Handbook) (edited by Rigaku Corp. 2000, International Academic Printing Co., Ltd.), and Kagaku Kogyo (Chemical Industry) January 1999, No. 22.

Specific examples of measurement methods which are useful for the present invention will now be described.

MXP21, produced by Mac Science Co., Ltd., is employed as a measurement device. Copper is employed as a target of the X-ray source, and operation is carried out at 42 kV and 500 mA. A multilayered film parabola mirror is employed in an incident monochrometer. A 0.05×5 mm incident slit and a 0.03×20 mm light accepting slit are employed. By employing a 2θ/θ scanning system, measurements are carried out via the FT method of a step width of 0.005° and one step each 10 seconds. The obtained reflectivity curve is subjected to curve fitting, employing REFLECTIVITY ANALYSIS PROGRAM Ver. 1, produced by Mac Science Co., Ltd., and each parameter is obtained so that the residual sum of squares of measured values and the fitting curve become minimal. It is possible to obtain the film density of each layer from each parameter.

Further, in the moisture-proof cellulose ester film of the present invention, moisture transmittance (also referred to as water vapor transmission rate) is preferably 0.01-50 g/m$^2$/day, but is more preferably 0.1-50 g/m$^2$/day.

Moisture transmittance (also referred to as water vapor transmission rate), as described in the present invention, can be obtained via measurement, employing the method described in JIS K 7129B. Specific devices which can be employed for the measurement include a water vapor transmission rate meter, PERMATRAN-W 3/33 MG MODULE, produced by MOCON Corp. The moisture transmittance according to the present invention refers to the value determined under conditions of 40° C. and 90% relative humidity.

Further, in the moisture-proof cellulose ester film of the present invention, the total thickness of the adhesion layer, the barrier layer, and the protective layer which are produced on at least one side of the cellulose ester film, is preferably 1-100 nm. Further, its feature is that the thickness of the barrier layer is 0.1-30 nm, and the thickness of the barrier layer is preferably 0.1-5.0 nm.

It is possible to obtain the thickness of each constituting layer and the total layer thickness according to the present invention in the same manner as above, from each parameter obtained by the X-ray reflectivity method.

(Laminated Layer Barrier Film)

Each constituting layer which is provided on a cellulose ester film will now be detailed.

In the moisture-proof cellulose ester film of the present invention, it is characterized that on at least one side of a cellulose ester film, are arranged at least one of each of the adhesion layer at a carbon content ratio of 17-40% in terms of atomic concentration, which is composed of inorganic compounds as a main component, the barrier layer at a carbon content of at most 0.1% in terms of atomic concentration and a film density of 2.16-2.60, which is composed of silicon oxide as a main component, and the protective layer (hereinafter, these may be referred to as a laminated layer barrier film) at a carbon content ratio of 1-40% in terms of atomic concentration, which is composed of inorganic compounds as a main component. It is preferable that by optimizing the types of materials employed to form each layer and constituting conditions, the total thickness is regulated to be 1-100 nm. When the thickness of the laminated layer barrier film is less than the lower limit, it is not possible to prepare a uniform film, whereby it is difficult to obtain sufficient barring properties against gases (water vapor). Further, it is characterized that the thickness of the barrier layer is preferably 0.1-30 nm, but is more preferably 0.1-5.0 nm. When the thickness of the barrier layer exceeds the upper limit, it is difficult to maintain flexibility of the moisture-proof cellulose ester film, whereby cracking may become a concern on the laminated layer barrier film due to external factors such as folding or pulling after film production.

The adhesion layer of the present invention functions to relax stress and simultaneously enhances close contact and adhesion to the cellulose ester film. The thickness of the adhesion layer is preferably 1-90 nm, but is more preferably 1-50 nm. Further, the protective layer is a layer to protect the barrier layer. The thickness thereof is preferably 1-90 nm, but is more preferably 5-90 nm.

The laminated layer barrier film according to the present invention, namely the adhesion layer, the barrier layer, and the protective layer, is characterized in that in practice, the adhesion layer and the protective layer are composed of inorganic compounds as a main component, while the barrier layer is composed of silicon oxide as a main component. As noted above, inorganic compounds according to the present invention include metal carbides, metal nitrides, metal oxides, metal sulfides, and metal halides, as well as mixtures thereof (such as metal oxide nitrides, metal oxide halides, and metal nitride carbides). Of these, preferred are the metal oxides, the metal oxide nitrides, and the metal nitrides. Preferably listed are silicon oxide, aluminum oxide, silicon oxide nitride, aluminum oxide nitride, magnesium oxide, zinc oxide, indium oxide, and tin oxide, and silicon oxide is particularly preferred.

In the present invention, it is preferable that the adhesion layer and the protective layer incorporate the same elements as those incorporated in the barrier layer. For example, when the barrier layer incorporates Si, O, and C, it is preferable that the adhesion layer and the protective layer also incorporate Si, O and C.

Methods which sequentially form these adhesion layer, barrier layer and protective layer on a cellulose ester film are not particularly limited and include, a spraying method via a sol-gel method, a spin coating method, a sputtering method employing metal compounds, a vacuum deposition method, and a plasma CVD method, as well as a plasma CVD method under atmospheric pressure or near atmospheric pressure, which is described below.

However, when the sol-gel method (being a wet system method) such as the spraying method or the spin coating method) is employed, it is difficult to realize desired smoothness at the molecular level. Further, since solvents are employed usable substrates are limited. Consequently, those employing the plasma CVD method are preferred. Further, of these, the atmospheric pressure or near atmospheric pressure plasma CVD method is preferred, since it requires no reduced pressure chamber, is achievable of high rate film production (hereinafter referred to as the atmospheric pressure plasma CVD method). Forming conditions of each layer via the plasma CVD method are detailed below.

It is preferable that the laminated layer barrier film is composed of a plurality of films which differ in density. Depending on production conditions, the types and ratio of the employed raw materials, difference in the degree of packing of ceramic particles, and a minute amount of impurity particles occurs to result in difference in physical properties such as density.

The film density of the adhesion layer and the protective layer according to the present invention is less than that of the barrier layer. Films are preferred which exhibit a density of at most 95% of the barrier layer. These layers exhibit relatively low density and are not capable of blocking water vapor as the barrier layer does. However, they are relatively flexible and are capable of functioning as a adhesion layer or a protective layer as a stress relaxing layer even though the layer is composed of the same composition.

With regard to the specific density of each layer, as noted above, the film density of the barrier layer is preferably 2.16-2.60, while the film density of the adhesion layer and the protective layer is preferably 1.7-2.0.

In the present invention, it is preferable that the adhesion layer, the barrier layer, and the protective layer which constitute the laminated layer barrier film is formed via the atmospheric pressure plasma CVD method.

Accordingly, in the present invention, it is preferable that at least one of the adhesion layer, the barrier layer, and the protective layer, or all the layers according to the present invention are formed on the above cellulose ester film via the thin-film forming atmospheric pressure plasma CVD method in such a manner that under atmospheric pressure or near atmospheric pressure, gases incorporating thin-film forming gas and discharge gas are applied to a discharge space and a high frequency electric field is applied to the above space to excite the gases, followed by exposure to the excited gases.

In such thin film formation via the atmospheric plasma CVD method, the thin film forming gases are composed mainly of a material gas to form a thin film, a decomposition gas which decomposed the above material gas to prepare thin film forming compounds, and a discharge gas to form a plasma state.

In the moisture-proof cellulose ester film of the present invention, methods to form the adhesion layer, the barrier layer, and the protective layer, each of which is composed within the targeted film density range, are not particularly limited. However, it is preferable that along with the selection of optimal raw materials, the composition ratio of the raw material gas, the decomposition gas and the discharge gas, as well as the gas feeding rate to the plasma discharge generating apparatus, and output conditions during plasma discharge processing are appropriately selected.

In the moisture-proof cellulose ester film of the present invention, the density of the barrier layer is set to be higher than that of each of the adhesion layer and the protective layer, which are located thereon or under it. In the adhesion layer, the barrier layer, and the protective layer according to the present invention, each of the layers may be classified, for example, via difference in density, content amount of raw material compounds, and hardness of each of the thin layers. In the present invention, by determining the carbon content amount in each layer, it is possible to classify the adhesion layer, the barrier layer, and the protective layer.

Namely, in the moisture-proof cellulose ester film, a low density film exhibits correlation with a high carbon content film, while a high density film exhibits correlation with a low carbon content film. Accordingly, other than the density difference as described above, it is possible to confirm the border section of each layer via difference in the carbon content.

In the present invention, the barrier layer is constituted to result in a relatively high film density of 2.16-2.60, while the closely adhered film and the protective film are constituted to result in a relatively low film density of 1.7-2.0 so that they are relatively flexible.

Materials which are employed to form the adhesion layer, the barrier layer, and the protective layer according to the present invention will now be described.

It is possible to realize the desired compositions such as metal carbides, metal nitrides, metal oxides, metal sulfides, metal halides, or mixtures thereof (such as metal oxide halides or metal nitride carbides) of the laminated layer barrier film according to the present invention, which is prepared via the plasma CVD method or the atmospheric pressure plasma CVD method by selecting conditions such as organic metal compounds which are materials (also referred to as raw materials), the decomposition gas, the decomposition temperature, and the input electric power.

For example, by employing silicon compounds as a material compound and oxygen as a decomposition gas, silicon oxides are formed. Further, by employing zinc compounds as a material compound and carbon disulfide as a decomposition gas, zinc sulfide is formed. The mechanism for the above is as follows. Since highly active charged particles-active radicals exist at high density in a plasma space, multistage chemical reactions are enhanced at a high rate, whereby elements which exist in the plasma space are converted to thermodynamically stable compounds within a very short time.

Materials as such inorganic compounds may be in any state of gas, liquid or solid at normal temperature and pressure, as long as they incorporate the typical or transition metal atoms. When they are gases, they may be introduced into a discharge space without any modification. However, when they are liquids or solids, they are employed after being vaporized via means such as heating, bubbling, pressure reduction, or exposure to ultrasonic waves. They may be diluted via solvents, which include organic solvents such as methanol, ethanol, n-hexane, or mixtures thereof. Incidentally, since dilution solvents are decomposed to their molecular or atomic state during plasma discharge processing, it is possible to ignore their effects.

such organic metal compounds include silane, tetramethoxysilane, tetraethoxysilane, tetra n-propoxysilane, tetraisopropoxysilane, tetra n-butoxysilane, tetra t-butoxysilane, dimethyldimethoxysilane, dimethyldiethoxysilane, dimethyldimethoxysilane, diphenyldimethoxysilane, methyltriethoxysilane, ethyltrimethoxysilane, phenyltriethoxysilane, (3,3,3-trifluoropropyl)trimethoxysilane, hexamethyldicyloxane, bis(dimethylamino)dimethylsilane, bis(dimethylamino)methylvinylsilane, bis(ethylamino) dimethylsilane, N,O-bis(trimethylsilyl)acetamide, bis(trimethylsilyl)carbodiimide, diethylaminotrimethylsilane, dimethylaminodimethylsilane, hexamethyldisilazane, heptamethyldisilazane, nanomethyltrisilazane, octamethylcycloteterasilaxane, tetrakisdimethylaminosilazane, tetraisocyanatosilane, tetramethyldisilazane, tris(dimethylamino) silane, triethoxyfluorosilane, allyldimethylsilane, allyltrimethylsilane, benzyltrimethylsilnae, bis(trimethylsilyl)acetylene, 1,4-bistrimethylsilyl-1,3-butadyin, di-t-butylsilane, 1,3-disilabutane, bis(trimethylsilyl)methane, cyclopentadyenyltrimethylsilane, phenyldimethylsilane, phenyltrimethylsilane, propalgyltrimethylsilane, tetramethylsilane, trimethylsilylacetylene, 1-(trimethylsilyl)-1-propin, tris(trimethylsilyl)methane, tris(trimethylsilyl)silane, vinyltrimethylsilane, hexamethyldisilane, octamethylcyclotetrasiloxane, tetramethylcyclotetrasiloxane, hexamethylcyclotetrasiloxane, and M silicate 51.

Examples of titanium compounds include titanium methoxide, titanium ethoxide, titanium isopropoxide, titanium tetraisopropoxide, titanium n-butoxide, titanium diisopropoxide(bis-2,4-pentanedionate), titanium diisopropoxide (bis-2,4-ethylacetate), titanium di-n-butoxide(bis-2,4-pentanedionate), titanium acetylacetonate, and butyl titanium dimers.

Zirconium compounds include zirconium n-propoxide, zirconium n-butoxide, zirconium t-butoxide, zirconium tri-n-butoxidoacetylacetonate, zirconium di-n-butoxidobisacetylacetonate, zirconium acetylacetonate, zirconium acetate, and zirconium hexafluoropentanedionate.

Aluminum compounds include aluminum ethoxide, aluminum triisoproxide, aluminum isopropoxide, aluminum n-butoxide, aluminum s-butoxide, aluminum t-butoxide, aluminum acetylacetonate, and triethyl dialuminum tri-s-butoxide.

Boron compounds include diborane, tetraborane, boron fluoride, boron chloride, boron bromide, borane-diethyl ether complexes, borane-THF complexes, borane-dimethylsulfide complexes, boron trifluoride diethyl ether, triethylborane, trimethoxyborane, triethoxyborane, tri(isopropoxy)borane, borazole, trimethylborazole, triethylborazole, and triisopropylborazole.

Tin compounds include tetraethyl tin, tetramethyl tin, diacetic acid di-n-butyl tin, tetrabutyl tin, tetraoctyl tin, tetraethoxy tin, methyltroethoxy tin, diethyldiethoxy tin, triisopropylethoxy tin, diethyl tin, dimethyl tin, diisopropyl tin, dibutyl tin, diethoxy tin, dimethoxy tin, diisopropoxy tin, dibutoxy tin, tin dibutylate, tin diacetacetate, ethyltin acetoacetate, ethoxytin acetacetonate, dimethyltin acetacetonate, tin hydride compounds, and tin halide compounds such as tin dichloride or tin tetrachloride.

Further, examples of other organic metal compounds include antimony ethoxide, arsenic triethoxide, barium 2,2, 6,6-tetramethylheptanedionate, beryllium acetylacetonate, bismuth hexafluoropentanedionate, dimethyl cadmium, calcium 2,2,6,6-tetramethylheptanedionate, chromium trifluoropentanedionate, cobalt acetylacetonate, copper hexafluoropentanedionate, magnesium hexafluoropentanedionate-dimethyl ether complexes, gallium ethoxide, tetraethoxy germane, tetramethoxy germane, hafnium t-butoxide, hafnium ethoxide, indium acetylacetonate, indium 2,6-dimethylaminoheptanedionate, ferrocene, lanthanum isopropoxide, lead acetate, tetraethyl lead, neodymium acetylacetonate, platinum hexafluoropentanedionate, trimethylcyclopentadienyl platinum, rhodium dicarbonylacetylaceonate, strontium 2,2,6,6-tetramethylheptanedionate, tantalum methoxide, tantalum trifluoroxide, tellurium ethoxide, tungsten ethoxide, vanadium triisopropoxidooxide, magnesium hexafluoroacetylacetonate, zinc acetylacetonate, and diethyl zinc.

Further listed as decomposition gases which are employed to prepare inorganic compounds by decomposing raw material gases incorporating these metals are hydrogen gas, methane gas, acetylene gas, carbon monoxide gas, carbon dioxide gas, nitrogen gas, ammonia gas, nitrous oxide gas, nitrogen oxide gas, nitrogen dioxide gas, oxygen gas, water vapor, fluorone gas, hydrogen fluoride, trifluoroalcohol, trifluorotoluene, hydrogen sulfide, sulfur dioxide, carbon disulfide, and chlorine gas.

By selecting appropriate material gases and decomposition gases, it is possible to prepare various types of metal carbides, metal nitrides, metal oxides, metal halides, and metal sulfides.

These reactive gases are blended with discharge gases which tend to mainly result in a plasma state, and the resulting mixture is fed into a plasma discharge generating apparatus.

As such a discharge gas, employed are nitrogen gas and/or Group 18 atoms in the periodic table which specifically include helium, neon, argon, krypton, xenon and radon. Of these, nitrogen, helium, and argon are preferably employed.

The above discharge gases and reactive gases are blended and, the resulting mixture is fed into a plasma discharge generating apparatus (being a plasma generating apparatus) as a thin film forming (mixed) gas, followed by film formation. The ratio of the discharge gases to the reactive gases varies depending on the targeted quality of the film to be prepared. The ratio of the discharge gases to the total mixed gas is regulated to be at least 50%, and the reactive gas is fed.

In the laminated layer barrier film according to the present invention, an organic compound incorporated in the laminated layer barrier film is preferably silicon oxide, which is preferred in view of water vapor blocking properties, light transmission, and atmospheric pressure plasma CVD capability, as described below.

With regard to the inorganic compounds according to the present invention, it is possible to prepare, for example, a film incorporating at least either O atoms or N atoms and Si atoms by combining the above organic silicon compounds with oxygen gas and nitrogen gas at the specified ratio.

<<Cellulose Ester Film>>

(Cellulose Ester)

Cellulose ester, which is a material of cellulose ester film which is applied to the moisture-proof cellulose ester film of the present invention, is one in which the hydroxyl group derived from cellulose is substituted with an acetyl group. The degree of substitution by the acyl group of cellulose ester which is beneficial in the present invention is 2.50-2.98. The acyl group may include one having 2-4 carbon atoms such as an acetyl group, a propionyl group or a butylyl group, or a mixture thereof. For example, employable is cellulose ester having a mixed acyl group including a propionyl group and a butylyl group, other than an acetyl group, such as cellulose acetate propionate, cellulose acetate butyrate, or cellulose acetate propionate butyrate. However, in view of strength, of the degree of substitution by the acyl group, the degree of substitution by the acetyl group is preferably at least 1.4. By introducing a propionyl group as a substituent, it is possible to decrease moisture regain of cellulose ester film and to enhance its moisture and heat resistance.

Raw material cellulose for cellulose ester is not particularly limited and may include cotton linter, wood pulp, and kenaf. Further, cellulose esters prepared via the above may be employed upon being blended at an appropriate ratio.

Cellulose ester is prepared in such a manner that cellulose as a raw material is allowed to react with acetic anhydride (if desired, together with propionic anhydride and butyric anhydride) as an acylating agent by employing organic acids such as acetic acid, organic solvents such as methylene chloride, and further protonic catalysts such as sulfuric acid. When the acylating agent is acetic acid chloride $CH_3COCl$ (if needed, together with $C_2H_5COCl$ and $C_3H_7COCl$), a reaction is performed employing basic compounds such as amine as a catalyst. Specifically, it is possible to achieve synthesis based on the methods described in JP-A Nos. 9-286801 and 10-45804.

Further, cellulose ester is prepared in such a manner that after dissolving cellulose ester in organic solvents, acetic acid is added; the resulting mixture undergoes hydrolysis at an appropriate temperature for an appropriate time under reduced pressure while removing the organic solvents; and at a targeted degree of substitution, the hydrolyzed products are charged into a large amount of water, followed by precipitation, washing, and drying.

It is possible to determine the degree of substitution by an acetyl group, based on ASTM-D817-96.

The number average molecular weight of cellulose ester employed for the cellulose ester film which is beneficial for the present invention is preferably in the range of 60,000-300,000, but is more preferably in the range of 70,000-200,000, since the resulting film exhibits higher mechanical strength.

<Plasticizers>

It is preferable that the cellulose ester film which is beneficial in the present invention incorporates plasticizers in an amount of 1-30 parts by weight with respect to 100 parts by weight of cellulose ester. Incorporation of plasticizers within the above range enables production of cellulose ester films which exhibit appropriate retardation in the thickness direction, as well as excellent transparency, and moisture and heat resistance.

It is possible to preferably employ, as plasticizers, conventional ones for cellulose esters. Those which exhibit higher compatibility are particularly preferred, and for example, preferred are phosphoric acid esters and carboxylic acid esters. Examples of the phosphoric acid esters may include triphenyl phosphate (this plasticizer is abbreviated as TPP), tricresyl phosphate, phenyldiphenyl phosphate, diphenyl phosphate (this plasticizer is abbreviated as DPP), and phediphenylbisphenyl phosphate. Carboxylic esters include phthalic acid esters and citric acid esters. Examples of the phthalic acid esters may include dimethyl phthalate, diethyl phthalate, dioctyl phthalate, and diethylhexyl phthalate, while examples of the citric acid esters may include acetyltriethyl citrate and acetyltributyl citrate. Further, other than the above listed may be butyl oleinate, methylacetyl ricinolate, dibutyl sebacate, and triacetin. Further, in the present invention usefully and preferably employed are alkylphthalylalkyl glycolates incorporating phthalic acid esters and glycolic esters in one molecule. The number of carbon atoms of the alkylphthalylalkyl glycolates is preferably 1-8. Alkylphthalylalkyl glycolates may include methylphthalylmethyl glycolate, ethylphthalylethyl glycolate, propylphthalylpropyl glycolate, butylphthalylbutyl glycolate, octylphthalyloctyl glycolate, methylphthalylethyl glycolate, ethylphthalylmethyl glycolate, ethylphtalylpropyl glycolate, propylphthalylethyl glycolate, methylphthalylpropyl glycolate, methylphthalylbutyl glycolate, ethylphthalylbutyl glycolate, butylphthalylmethyl glycolate, butylphthalylethyl glycolate, propylphthalylbutyl glycolate, butylphthalylpopyl glycolate, methylphthalyloctyl glycolate, ethylphthalyloctyl glycolate, octylphthalylmethyl glycolate, and octylphthalylethyl glycolate. Of these, preferably employed are the methylphthalylmethyl glycolate, the ethylphthalylethyl glycolate, the propylphthalylpropyl glycolate, butylphthalylbutyl glycolate, and the octylphthalyloctyl glycolate, and the ethylphthalylethyl glycolate (this plasticizer is abbreviated as EPEG) is most preferably employed. Further, these alkylphthalylalkyl glycolates may be employed in combinations of at least two types.

<UV Absorbers>

It is preferable that the cellulose ester films which are beneficial in the present invention incorporate UV absorbers such as benzotriazole based compounds or benzophenone based compounds.

Benzotriazole based compounds and benzophenone based compounds may be employed in a mixture of at least two types. Benzotriazole based compounds and benzophenone based compounds may be blended and then employed.

Examples of benzotriazole based compounds which are beneficial in the present invention may include 2-(2'-hydroxy-5'-methylphenyl)benzotriazole, 2-(2'-hydroxy-3',5'- di-t-butylphenyl)benzotriazole, 2-(2'-hydroxy-3'-t-butyl-5'-methylphenyl)benzotriazole, 2-(2'-hydroxy-3',5'-di-t-butylphenyl)-5-chlorobenzotriazole (this compound is designated as BT-1), 2-(2'-hydroxy-3'-(3",4",5",6"-tetrahydrophthalimidomethyl)-5'-methylphenyl)benzotriazole, 2,2-methylenebis(4-(1,1,3,3-tetramethylbutyl)-6-(2H-benzotriazole-2-yl)phenol), 2-(2'-hydroxy-3'-t-butyl-5'-methylphenyl)-5-chlorobenzotriazole, 2-(2H-benzotriazole-2-yl)-6-(straight chain or side chain dodecyl)-4-methylphenol, octyl-3-[3-t-butyl-4-hydroxy-5-(chloro-2H-benzotriazole-2-yl)phenyl] propionate, and 2-ethylhexyl-3-[3-tert-butyl-4-hydroxy-5-(5-chloro-2H-benzotriazole-2-yl)phenyl] propionate. Any of these may be preferably employed. Some of these benzotriazole based compounds are produced by Ciba Specialty Chemicals Co., Ltd. Their examples may include TINUVIN 109, TINUVIN 171, TINUVIN 326, TINUVIN 327, and TINUVIN 328, and any of these may be preferably employed.

Further, examples of useful benzophenone based compounds may include 2-hydroxy-4-benzyloxybenzophenone (this compound is abbreviated as BF-1), 2,4-dihydroxybenzophenone, 2,2'-dihydroxy-4-methoxybenzophenone, 2-hydroxy-4-methoxy-5-sulfobenzophenone, and bis(2-methoxy-4-hydroxy-5-benzoylphenylmethane).

<Antioxidants>

It is preferable that cellulose ester films incorporate antioxidants.

Hindered phenol based compounds are preferably employed as an antioxidant, and preferred are 2,6-di-t-butyl-p-cresol, pentaerystilyl-tetrakis[3-(3,5-di-t-butyl-4-hydroxyphenyl)propionate], triethylene glycol-bis[3-(3-(3-t-butyl-5-methyl-4-hydrocyphenyl]propionate], 1,6-hexanediol-bis [3-(3,5-di-t-butyl-4-hydroxyphenyl)propionate], 2,4-bis-(n-octylthio)-6-(4-hydroxy-3,5-di-t-butylalinino)-1,3,5-triazine, 2,2-thio-diethylenebis[3-(3,5-di-t-butyl-4-hydroxyphenyl)propionate, octadecyl-3-(3,5-dit-butyl-4-hydroxyphenyl)propionate, N,N'-hexamethylenebis(3,5-di-t-butyl-4-hydroxy-hydroxycinnamide), 1,3,5-trimethyl-2,4,6-tris(3,5-di-t-butyl-4-hydroxybenzyl)benzene, and tris-(3,5-di-t-butyl-4-hydroxybenzyl-isocyanurate. Particularly preferred are 2,6-di-t-butyl-p-cresol, pentaeryslyl-tetrakis[3-(3,5-di-t-butyl-4-hydroxyphenyl)propionate], and triethylene glycol bis[3-(3-t-butyl-5-methyl-4-hydroxyphenyl)propionate]. Further, simultaneously employed may be hydrazine based metal inactivating agents such as N,N'-bis [3-(3,5-di-t-butyl-4-hydroxyphenyl)propionyl]hydrazine and phosphorous based process stabilizing agents such as tris(2,4-di-t-butylphenyl)phosphite.

<Minute Particles>

In order to provide targeted sliding property, it is preferable that the cellulose ester film, which is beneficial in the present invention, incorporates minute particles particularly in the layer near its surface or in the surface layer. Minute particles, which are beneficial in the present invention, may be either inorganic or organic compounds. Preferred inorganic compounds include silicon-containing compounds, silicon dioxide, aluminum oxide, zirconium oxide, calcium carbonate, talc, clay, sintered kaolin, sintered calcium silicate, calcium silicate hydrated, aluminum silicate, magnesium silicate, and calcium phosphate. Of these, silicon-containing inorganic compounds and zirconium oxide are more preferred, and silicon dioxide is most preferred, since it is possible to lower the turbidity of a cellulose ester laminated layer film.

<Organic Solvents>

Organic solvents which are beneficial to prepare the cellulose ester films employed in the present invention include chlorine based and non-chlorine based organic solvents. As the chlorine based organic solvent, listed may be methylene chloride. Examples of beneficial non-chlorine based organic solvents may include methyl acetate, ethyl acetate, amyl acetate, acetone, tetrahydrofuran, 1,3-dioxyolan, 1,4-dioxan, cyclohexanone, ethyl formate, 2,2,2-trifluoroethanol, 2,2,3,3-hexafluoro-1-propanol, 1,3-difluoro-2-propanol, 1,1,1,3,3,3-hexafluoro-2-methyl-2-propanol, 1,1,1,3,3,3-hexafluoro-2-propanol, 2,2,3,3,3-pentafluoro-1-propanol, and nitroethane. Of these, methyl acetate and acetone are preferably employed. It is preferable to employ these organic solvents in an amount of at least 50% by weight with respect to the total solvents, since it is possible to enhance solubility of cellulose-esters in organic solvents.

<Manufacturing Method of Cellulose Ester Film>

It is possible to manufacture the cellulose ester film according to the present invention via common methods known in the art. For example, resins employed as a material is melted via an extruder, extruded via a circular die or a T die and then immediately cooled, whereby it is possible to manufacture an unstretched substrate which is substantially amorphous, but not oriented. Further, by stretching the unstretched substrate in the substrate transporting (longitudinal) direction or perpendicular (lateral direction) to the substrate transporting direction via a conventional method such as uniaxial stretching, tenter system sequential biaxial stretching, tenter system simultaneous biaxial stretching, or tubular system simultaneous biaxial stretching, it is possible to manufacture a stretched substrate. In this case, even though it is possible to select a stretching factor depending on resins employed as the raw material for the substrate, the factor is preferably 2-10 in the longitudinal direction and the lateral direction.

Further, with regard to the cellulose ester film according to the present invention, prior to forming the adhesion layer according to the present invention, conducted may be surface treatments such as a corona treatment, a flame treatment, a plasma treatment, a glow discharge treatment, a surface roughening treatment or a chemical treatment.

A cellulose ester film is conveniently employed when it is wound into a long-roll film. The thickness of a resin film is not particularly limited since it varies depending on the use of the resulting moisture-proof cellulose ester film. However, the film thickness in the shape of film is preferably 10-200 µm, but is more preferably 50-100 µm.

The above-cited cellulose ester films are available on the market. For example, it is preferable to employ KONICA MINOLTA TAC KC4UX2M or KC8UX2M, produced by Konica Minolta Opto, Inc., which is a cellulose triacetate film.

<<Atmospheric Pressure Plasma CVD Method>>

With regard to the moisture-proof cellulose ester film of the present invention, it is preferable that at least one of the adhesion layer, the barrier layer, and the protective layer, or preferably all the layers according to the present invention are formed via an atmospheric pressure plasma CVD method.

As an atmospheric plasma CVD method to form the adhesion layer, the barrier layer, and the protective layer according to the present invention, employed may be the thin film forming methods described in JP-A Nos. 10-154598 and 2003-49272, as well as No. WO02/048428 Pamphlet. Further, the thin film forming method, described in JP-A No. 2004-68143 is preferable to form a barrier layer which is accurate, exhibits high gas barring properties, and low compression stress. Due to that, by selecting thin film forming gases, as described above, and regulating each of the forming conditions, it is possible to form, on a cellulose ester film, the adhesion layer, the barrier layer, and the protective layer provided with the characteristics specified in the present invention. Further, these layers are continuously formed while a web substrate is unwound from a long roll.

The above atmospheric pressure plasma CVD method according to the present invention is performed under atmospheric pressure or near pressure, which refers to pressure between about 20-about 110 kPa, but preferably between 93-104 kPa to realize the targeted effects presented in the present invention.

In the present invention, in view of further realizing the targeted effects of the present invention, it is preferable to employ, as the atmospheric pressure plasma CVD method, a thin film forming method in which gases incorporating thin film forming gases and discharge gases are applied into a discharge space under atmospheric pressure or near pressure thereof; a high-frequency electric field is applied into the above space to excite the above gases, and by exposing a cellulose ester film to the above excited gases, a thin film is formed on the above cellulose ester film.

Further, in the atmospheric pressure plasma CVD method, it is preferable to produce a film under the following conditions: nitrogen gas is employed as a discharge gas, the applied high-frequency electric field is one in which a first high-frequency electric field and a second high-frequency electric field are superposed, frequency $\omega_2$ of the above second high-frequency electric field is higher than frequency $\omega_1$ of the first high-frequency electric filed, strength $V_1$ of the above first high-frequency electric field, strength $V_2$ of the above second high-frequency electric field, and strength IV of the electric field at the beginning of discharge satisfy the relationship of $V_1 \geq 2$ IV>$V_2$ or $V_1$>IV$\geq V_2$, and the output intensity of the second high-frequency electric field is at least 1 W/cm².

Namely, the discharge conditions in the present invention are that at least two electric fields which differ in frequency are applied into a discharge space, and an electric field, in which the first high-frequency electric field and the second high-frequency electric field which are superposed, is applied.

Frequency $\omega_2$ of the above second high-frequency electric field is higher than frequency $\omega_1$ of the above first high-frequency electric field, and strength $V_1$ of the above first high-frequency electric field, strength $V_2$ of the above second high-frequency electric field, and strength IV of the electric field at the beginning of discharge satisfy the relationship of:

$V_1 \geq IV > V_2$ or $V_1 > IV \geq V_2$ and the output intensity of the above second high-frequency electric field is at least 1 W/cm².

"High-frequency", as described herein, refers to one having a frequency of at least 0.5 kHz.

When both of the superposed high-frequency electric fields exhibit a sine wave, a component results in which frequency $\omega_1$ of the first high-frequency electric field and frequency $\omega_2$ which is higher than the above frequency $\omega_1$ of the first high-frequency electric field is overlapped, and the resulting waveform becomes a sawtooth waveform in which on the sine wave of frequency $\omega_1$, the sine wave of frequency $\omega_2$ which is higher than the above is overlapped.

"Electric field strength to initiate discharge", as described in the present invention, refers to the lowest electric field strength which enables to result in discharge in the discharge space which is practically employed for the thin film forming method and under reaction conditions (such as gas conditions). The electric field strength to initiate discharge varies somewhat depending on the types of gases supplied to the discharge space, the types of dielectrics of electrodes, or the distance between the electrodes, but in the same discharge space, is subjected to the electric field strength to initiate discharge of the discharge gases.

It is assumed that by applying the high-frequency electric filed as described above into a discharge space, discharge capable of forming a thin film is generated, whereby it is possible to generate the high intensity plasma needed to form high quality thin films.

In this case, it is critical that the high-frequency electric field, as described above, is applied between the facing electrodes, namely to the same discharge space. The method is not preferred in which as described in JP-A No. 11-16696, two applying electrodes are placed side by side and a different high-frequency electric field is applied to each of the separate discharge spaces.

In the above, superposition of continuous waves, such as a sine wave, was described. The present invention is not limited thereto, and both may be pulse waves, while one may be a continuous wave and the other is a pulse wave. Further, a third electric field which differs in frequency may be available.

As a specific method in which the high-frequency electric field is applied to the same space, for example, an atmospheric pressure plasma discharge processing apparatus is employed in which a first power source, which applies the first high-frequency electric field at a frequency of $\omega_1$, and an electric field of $V_1$ is connected to the first electrode which constitutes the facing electrode, and the second power source which applies the second high-frequency electric field at a frequency of $\omega_2$ and an electric field strength of $V_2$ to the second electrode, is connected to the second power source.

In the above atmospheric pressure plasma discharge processing apparatus, gas feeding means, which feed discharge gases and thin film forming gases, are provided between the facing electrodes. Further, it is preferred that an electrode temperature controlling means, which controls the electrode temperature, is provided.

Further, it is preferable that a first filter is connected to any of the first electrode, the first power source, or the place between them, while a second filter is connected to any of the second electrode, the second power source, or the place between them. The first filter allows an electric current in the first high-frequency electric field from the first filter to easily pass to the first electrode. The electric current of the second high-frequency electric field is grounded, whereby the electric current in the high-frequency electric field tends to be not easily passed from the second power source to the first power source. Further, the second filter reversely functions in such a manner that the passage of electric current in the second high-frequency electric field from the second power source to the second electrode is facilitated, and by grounding the electric current in the first high-frequency electric field, an apparatus is employed which is provided with a function which retards the passage of the electric current of the first high-frequency electric field from the first power source to the second power source. "Not easily pass", as described herein, means that the electric current passes preferably at most 20%, but is more preferably at least 10%. On the contrary, "easily pass", as described herein, means that the electric current passage is preferably at least 80%, but is more preferably at least 90%.

For example, employed as a first filter may be a condenser at several tens—several ten thousands pF, or a coil of several µH corresponding to the frequency of the first power source. As the second filter, employed is a condenser of a coil of at least 10 µH corresponding to the frequency of the first power source. Via these coils or condensers, grounded to the earth, a use as a filter via these coils or condensers, employed as a filter ma be realized Further, it is preferable that the first power source of the atmospheric pressure plasma discharge processing apparatus of the present invention exhibits the capability of applying a higher electric field strength than that of the second power source.

"Applied electric field strength" and "discharge initiating electric field strength", as described herein refer to those determined by the following methods. Measurement Method of Applied Electric Field Strengths. V1 and V2 (unit: kV/mm):

A high-frequency voltage probe (P6015A) is arranged in each electrode section and the output signals of the above high-frequency voltage probe is connected to an oscilloscope (TDS3012B, produced by Tektronix, Inc.), whereby the electric field strength at a specified time is determined. Measurement Method of Electric Discharge Initiating Electric Field Strength IV (unit:kV/mm)

Electric discharge gases are supplied between the electrodes, and the electric filed strength between the above electrodes is increased. "Discharge initiating electric field strength" is defined as electric discharge initiating electric field IV. The measurement apparatus is the same as that employed to measure the above applied electric field strength measurement.

Incidentally, the measurement position of the electric field strength via the high-frequency voltage probe and the oscilloscope employed for the above measurements is illustrated in the FIG. 1 below.

By realizing discharge conditions specified in the present invention with regard to discharge gases such as nitrogen gas which exhibit a high electric field to initiate discharge, it is possible to maintain a stable plasma state at a high density, whereby it is possible to form a high quality thin film formation.

During the above measurement, nitrogen gas is employed as a discharge gas, and the resulting electric field strength IV(½Vp–p) is approximately 3.7 kV/mm. Consequently, in the above relationship, by applying the first applying electric field intensity of V1≧3.7 kV/mm, the nitrogen gas is excited, and it is possible to results in a plasma state.

Herein, it is possible to preferably employ, as a frequency of the first power source, at most 200 kHz. Further, the waveform of the above electric field may be either a continuous wave or a pulse wave. The lower limit is preferably about 1 kHz.

On the other hand, preferably employed is at least 800 Hz as a frequency of the second power source. As the frequency of the above second power source increases, the resulting plasma density is enhanced, whereby an accurate thin film of high quality is produced. The upper limit is preferably about 200 MHz.

When high-frequency electric fields are applied from two power sources as above, it is necessary to initiate the discharge of discharge gases having a relatively high strength of discharge initiating electric field. Further, the critical point of the present invention is that an accurate high quality thin film is formed via the higher frequency of the second high-frequency electric field, and high plasma density via high output intensity.

Further, by enhancing the output density of the first high-frequency electric field, it is possible to enhance the output density of the second high-frequency electric field while maintaining the uniformity of the discharge. By doing so, it is possible to generate a more uniform high density plasma, whereby it is possible to simultaneously increase the film producing rate and to enhance the film quality.

In the atmospheric pressure plasma discharge processing apparatus employed in the present invention, as described above, discharge is carried out between the facing electrodes; gases introduced between the above are subjected to a plasma state; and by exposing the above plasma state gases to a stationary substrate or transported between the facing electrodes, whereby a thin film is formed on the above substrate. Further, a jet system apparatus is available as another system. An atmospheric pressure plasma discharge processing apparatus is available in such a manner that discharge is carried out between the same facing electrodes as above; gases introduced between the above facing electrodes are excited or modified to a plasma state; the excited or plasma state gases are ejected in the form of a jet to the exterior of the facing electrodes, and a substrate (which may be either stationary or transported) is exposed to the above jet, whereby a thin layer is formed on the above substrate.

FIG. 1 is a schematic view showing one example of the ink-jet system atmospheric pressure plasma discharge processing apparatus which is beneficial in the present invention.

The jet system atmospheric pressure plasma discharge processing apparatus is an apparatus which incorporates a gas feeding means, and an electrode temperature regulating means, not shown in FIG. 1 (though shown in FIG. 2 below), other than a plasma discharge processing apparatus and an electric field applying means having two power sources.

Plasma discharge processing apparatus 10 incorporates facing electrodes composed of first electrode 11 and second electrode 12, and between the above facing electrodes applied are a first high-frequency electric field at frequency ω1, electric field intensity V1, and electric current I1, and a second high-frequency electric field at frequency ω2, electric field intensity V2, and electric current I2. First power source 21 achieves application of the high-frequency electric field strength (V1>V2) which is higher than that of second power source 22, while first power source 21 achieves application of frequency ω1 which is lower than frequency ω2 of second power source 22.

Between first electrode 11 and first power source 21, first filter 23 is arranged. It is designed in such a manner that the electric current from first power source 21 to first electrode 11 flows easily, while by grounding the electric current from second power source 22, the electric current from second power source 22 to first power source 21 does not flow easily.

Further, between second electrode 12 and second power source 22, second filter 24 is arranged. It is designed in such a manner that the electric current from second power source 22 to the second electrode easily flows, while by grounding the electric current from first electrode 21, the electric current from first electric power 21 to the second power source does not flow easily.

Figure 2:
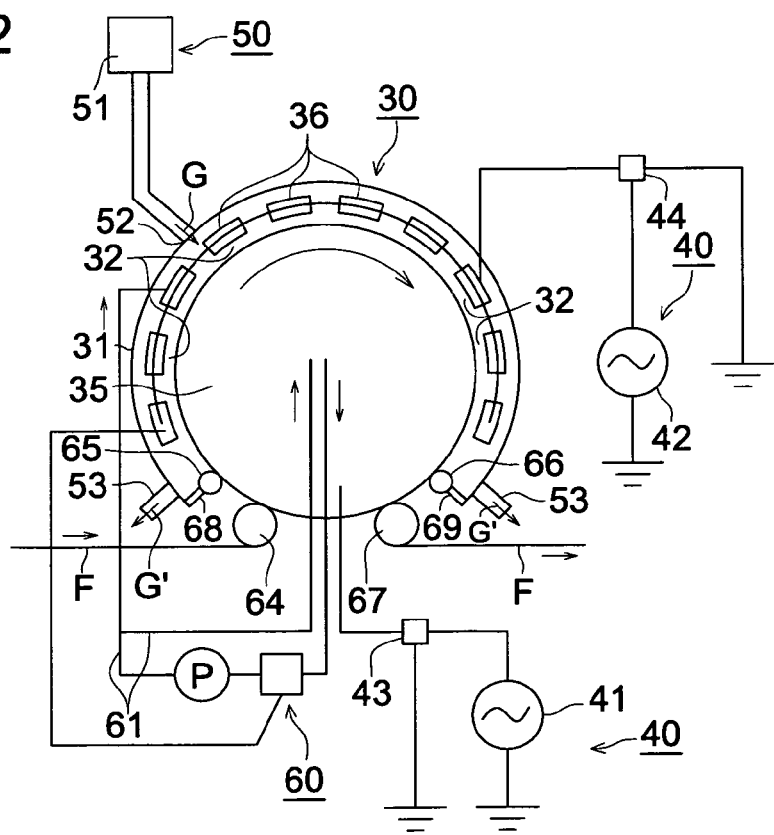
FIG. 2 is a schematic view showing one example of an atmospheric pressure plasma discharge processing apparatus of a system in which a substrate is processed between counter electrodes, which is useful for the present invention.

Aforesaid thin film forming gases G are introduced into space (the discharge space) 13 between the facing electrodes composed of first electrode 11 and second electrode 12 from the gas supplying means as described in FIG. 2. The aforesaid high-frequency electric field is applied between first electrode 11 and second electrode 12 to result in discharge. While modifying the above thin film forming gases G to a plasma state, the resulting gases are ejected onto the lower side (under side of a sheet) of the facing electrodes, and the processing space formed by the bottom surface of the facing electrodes and substrate F (cellulose ester film) is filled with gas G° in a plasma state. Subsequently, a thin film (a closely adhered film, a barrier layer, or a protective layer) is formed near processing position 14 on substrate F, which is transported from the roll (not shown) of the long substrate while being unwound, or transported from the previous process. During thin film formation, the electrodes are heated or cooled in such a manner that media pass through piping from the electrode temperature regulating means as shown in FIG. 2 below. During the plasma discharge processing, physical properties and compositions of the resulting thin film varies depending on the temperature of the substrate. In order to overcome the above, it is preferable that the temperature is appropriately controlled. As temperate controlling media, preferably employed are insulating materials such as distilled water or oil. During plasma discharge processing, it is desired that the temperature of the interior of electrodes is uniformly controlled so that non-uniform temperature in the lateral and longitudinal directions of the substrate results.

Further, shown in FIG. 1 are measuring instruments to measure the aforesaid applied electric field strength and the discharge initiating electric field strength, as well as their locations. In FIGS. 1, 25 and 26 each is a high-frequency voltage probe, and 27 and 28 each is an oscilloscope.

By arranging a plurality of jet system atmospheric plasma discharge processing apparatuses, parallel to the conveying direction of substrate F, and by simultaneously discharging the gases in the same plasma state, it is possible to form a plurality of thin films in the same position, whereby it is possible to form the targeted film thickness within a short time. Further, a plurality of apparatuses are arranged parallel to the substrate F conveying direction and different thin film forming gas is supplied to each apparatus and different plasma state gas is jetted, whereby it is possible to form a laminated thin layer composed of different layers.

FIG. 2 is a schematic view showing one example of an atmospheric pressure plasma discharge processing apparatus of a system which processes a substrate between the facing electrodes, which is beneficial in the present invention.

The atmospheric pressure plasma discharge processing apparatus of the present invention is one which incorporates at least plasma discharge processing apparatus 30, an electric field applying means having two power sources, gas feeding means 50, and electrode temperature regulating means 60.

Substrate F is subjected to a plasma discharge processing employing rotary roller electrode (first electrode) 35, a squared cylindrical type fixed electrode group (second electrode)(hereinafter, squared cylindrical type fixed electrode group is also designated as a fixed electrode group) 36, space 32 between the facing electrodes (hereinafter, the space between the facing electrodes is also designated as discharge space 32), where a thin film is formed.

It is so designed that to discharge space 32, formed between rotary roller electrode 35 and fixed electrode group 46, first high-frequency electric field of frequency $\omega_1$, electric field strength $V_1$ and electric current $I_1$ from first power source 41, is applied to rotary roller electrode 35, and high-frequency electric field of frequency $\omega_2$, electric field strength $V_2$ and electric current $I_2$ from second power source 42 is applied to fixed electrode group 36.

A design is performed as follows. Between rotary roller electrode 35 and first power source 41, first filter 43 is arranged and first filter 43 facilitates passage of electric current from first power source 41 to the first electrode; the electric current from second power source 42 is grounded so that passage of electric current from second power source 42 to first power source is not facilitated. Further, between fixed electrode group 36 and power source 42, second filter 44 is arranged which facilitates passage of electric current from second power source 42 to second electrode; the electric current from first power source 41 is grounded so that passage of electric current from first power source to second power source is not facilitated.

In the present invention, rotary roller electrode 35 may be employed as the second electrode, and further, squared cylindrical fixed electrode group 36 may be employed as the first electrode. In any case, the first electrode is connected to the first power source, while the second electrode is connected to the second power source. It is preferable that the first power source is subjected to application of higher high-frequency electric field strength ($V_1 > V_2$) than that of the second power source. Further, frequency exhibits the capability to realize $\omega_1 < \omega_2$.

Further, it is preferable that electric current $I_1 <$ electric current $I_2$. Electric current $I_1$ of the first high-frequency electric field is preferably 0.3-20 mA/cm$^2$, but is preferably 1.0-20 mA/cm$^2$. Further, electric current $I_2$ of the second high-frequency electric field is preferably 10-100 mA/cm$^2$, but is more preferably 20-100 mA/cm$^2$.

Thin film forming gas G generated by the gas generating apparatus of gas feeding means 50 is subjected to flow rate control via a gas flow rate regulating means, and introduced into plasma discharge processing vessel 31 through gas feeding inlet 52.

Substrate F is unwound from the long roll, not shown, and is conveyed. Alternatively, it is conveyed in the arrowed direction from a pre-process, and after passing guide roller 64, blocks air accompanied with nip roller 65, and conveyed between squared cylindrical electrode group 36 while brought into contact with rotary roller electrode 35 and rolled, transported between squared cylindrical fixed electrode group 36.

During conveyance, the electric field is applied from both of rotary roller electrode 35 and fixed electrode group 36, whereby discharge plasma is generated in the space between the facing electrodes (discharge space) 32. While substrate F is brought into contact with rotary roller electrode 35, it is wound and conveyed between squared fixed cylindrical electrode group 36, while wound.

A plurality of squared cylindrical fixed electrodes is arranged around the circumference which is greater than that of the above roller electrode, and the discharge area of the above electrodes is expressed by the sum of the area of the surface facing with rotary roller electrode 35 of the squared cylindrical fixed electrodes.

Substrate F is wound by a winder, not shown, after passing between nip roller 66 and guide roller 67, or conveyed to the following process.

Discharge processed processing exhaust gases G' are discharged from exhaust gas outlets 53.

During formation of a thin film, in order to heat or cool rotary roller electrode 35 and fixed electrode group 36, media of which temperature is regulated via electrode temperature regulating means 60, is transported to both electrodes via piping 61, employing liquid transporting pump P, whereby the temperature is regulated from the interior of the electrodes. Incidentally, 68 and 69 are partition plates which separate plasma discharge processing chamber 31 from the exterior.

Figure 3:
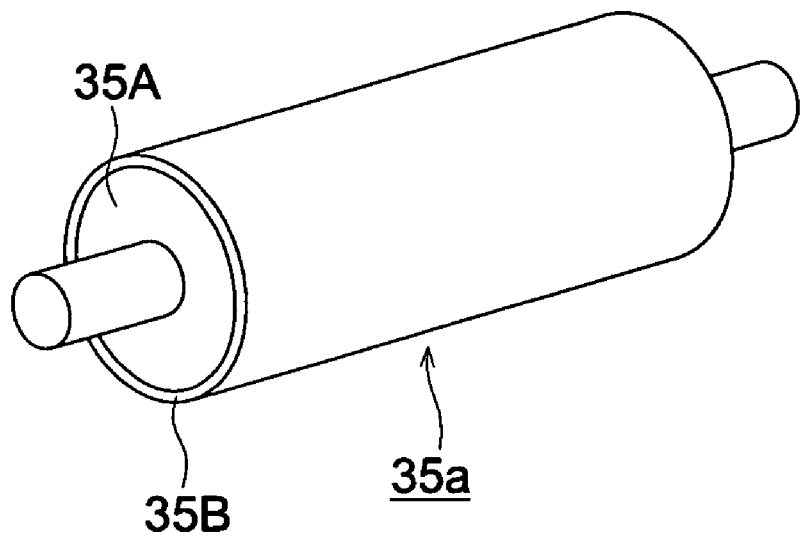
FIG. 3 is a perspective view showing one example of a structure of a metallic host material of the rotary roller electrode shown in FIG. 2, and a dielectric covered thereon.

FIG. 3 is a perspective view showing one example of the structure of a dielectric which covers the electrically conductive metallic host material of the rotary roller electrode shown in FIG. 2.

In FIG. 3, roller electrode 35a incorporates electrically conductive metallic host martial 35A having thereon dielectric 35B. Further, in order to control the surface temperature of the electrode during plasma discharge processing and to maintain the surface temperature of the substrate at a predetermined value, it is so structured that it is possible to circulate temperature regulating media (such as water or silicone oil).

Figure 4:
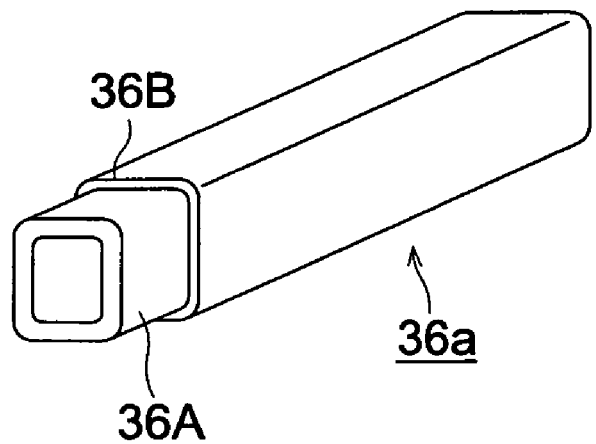
FIG. 4 is a perspective view showing one example of a structure of an electrically conductive metallic host material of a squared cylindrical electrode, and a dielectric covered thereon.

FIG. 4 is a perspective view showing one example of a structure of an electrically conductive host material of the squared cylindrical electrode covered with dielectrics.

In FIG. 4, squared cylindrical electrode 36a incorporates a coating of dielectric 36B which is the same as in FIG. 3 on electrically conductive metallic host 36A, and the structure of the above electrode is a metallic pipe, whereby it functions as a jacket and enables regulating the temperature during discharge.

Squared cylindrical electrode 36a, shown in FIG. 4, may be a circular cylindrical electrode. However, since the squared cylindrical electrode effects to broaden a discharge range (being a discharge area), compared to the circular cylindrical electrode, the squared cylindrical electrode is employed.

In FIGS. 3 and 4, on each of electrically conductive metallic host materials 35A and 36B, of roller electrode 35a and squared cylindrical electrode 36a, ceramics as dielectrics 35B and 36B are subjected to the thermal spray. Thereafter, a sealing process is carried out. The covered ceramic dielectrics at a thickness of about 1 mm on only one side are sufficient. Preferably employed ceramic materials employed for the thermal spray include alumina, as well as silicon nitride. Of these, alumina is most preferred due to its ease of workability. Further, a dielectric layer may be lining processed dielectrics in which inorganic materials are provided via lining.

As electrically conductive host materials 35A and 36B, listed may be metal titanium, titanium alloys, metals such as silver platinum, stainless steel, aluminum, or iron, as well as composite materials of iron and ceramics, and composite materials of aluminum and ceramics. Due to the reasons given below, particularly preferred are titanium metal or titanium alloys.

The electrode distance between the first electrode and the second electrode, which face each other, refers to the shortest distance, when a dielectric is arranged on one electrode, between the surface of the above dielectric and the surface of the electroconductive metallic host marital of the other electrode. When dielectrics are arranged on both electrodes, the above distance refers to the shortest distance between the surfaces of the dielectrics. The distance between electrodes is determined upon considering the thickness of the dielectrics arranged on conductive metallic host materials, the degree of applied electric field strength, and purposes to employ plasma. However, in each case, in view of realizing uniform discharge, the distance is preferably 0.1-20 mm, but is most preferably 0.5-2 mm.

Conductive metallic host materials and dielectrics, which are beneficial in the present invention, will be detailed later.

As plasma discharge processing chamber 31, preferably employed is a PYREX (the registered trade name) glass processing chamber. However, when insulation of the electrode is realized, it is possible to employ a metal chamber. For example, polyimide resins may be adhered to the interior surface of an aluminum or stainless steel frame, or ceramics may be thermally sprayed to result in insulation. In FIG. 1, it is preferable that both sides (near the substrate surface) of the parallel electrodes are covered with the materials as described above.

It is possible to list, as the first power source (the high-frequency power source), arranged in the atmospheric pressure plasma discharge processing apparatus, the following commercial products, all which are viable:

| Applied Power Source Designation | Manufacturer | Frequency | Product Name |
|---|---|---|---|
| A1 | Shinko Electric Co., Ltd. | 3 kHz | SPG3-4500 |
| A2 | Shinko Electric Co., Ltd. | 5 kHz | SPG5-4500 |
| A3 | Kasuga Electric Work Ltd. | 15 kHz | AGI-023 |
| A4 | Shinko Electric Co., Ltd. | 50 kHz | SPG50-4500 |
| A5 | Haiden Laboratory, Inc. | 100 kHz* | PHF-6k |
| A6 | Pearl Kogyo Co., Ltd. | 200 kHz | CF-2000-200k |
| A7 | Pearl Kogyo Co., Ltd. | 400 kHz | CF-2000-400k |

Further, it is possible to list, as the second power source (the high-frequency power source), the following commercial products, all which are preferably viable:

| Applied Power Source Designation | Manufacturer | Frequency | Product Name |
|---|---|---|---|
| B1 | Pearl Kogyo Co., Ltd. | 800 kHz | CF-2000-800k |
| B2 | Pearl Kogyo Co., Ltd. | 2 MHz | CF-2000-2M |
| B3 | Pearl Kogyo Co., Ltd. | 13.56 MHz | CF-5000-13M |
| B4 | Pearl Kogyo Co., Ltd. | 27 MHz | CF-2000-27M |
| B5 | Pearl Kogyo Co., Ltd. | 150 MHz | CF-2000-150MK |

Of the above power sources, the asterisk mark * is Haiden Laboratory, Inc. high-frequency power source (100 kHz in a continuous mode). Others are high-frequency power sources which are only subjected to application of continuous sine waves.

In the present invention, it is preferable to employ, in the atmospheric pressure plasma discharge processing apparatus, electrodes capable of maintaining a uniform and stable discharge state via application of the electric field as above.

In the present invention, electric power applied between the facing electrodes provides, to the second electrode (being the second high-frequency electric field), with electric power (output intensity) of at least 1 W/cm$^2$ to excite discharge gases, resulting in plasma generation, whereby energy is provided to film forming gases to form a thin film. The upper limit of the electric power applied to the second electrode is preferably 50 W/cm$^2$, but is more preferably 20 W/cm$^2$. The lower limit is preferably 1.2 W/cm$^2$. Discharge area (in cm$^2$) refers to the area covering the range in which discharge occurs between the electrodes.

Further, by also supplying electric power (being output intensity) of at least 1 W/cm$^2$ to the first electrode (being the first high-frequency electric filed), it is possible to enhance the output intensity while maintaining uniformity of the second high-frequency electric field. By doing so, it is possible to generate more uniform and higher intensity plasma, whereby it is possible to simultaneously enhance the film production rate and film quality. The electric power is preferably at least 5 W/cm$^2$. The upper limit of the electric power applied to the first electrode is preferably 50 W/cm$^2$.

Herein, the waveform of a high-frequency electric field is not particularly limited. There are a sine wave continuous oscillation mode called a continuous mode, and an intermittent oscillation mode called a pulse mode, which intermittently performs ON/OFF. Either of these may be employed. However, the continuous sine waves are preferred since by employing the continuous sine waves on the second electrode side (the second high-frequency electric field), it is possible to prepare a precise and high quality film.

It is critical that an electrode which is employed in the above atmospheric pressure plasma thin film forming method endures severe conditions in terms of structure and performance. As such an electrode, preferred is one which is prepared by covering a metallic host material with dielectrics.

In the dielectric covered electrode employed in the present invention, it is preferable that characteristics of various metallic host materials are compatible with those of dielectrics. One of these characteristics is that a metallic host material and a dielectric are combined so that difference in linear thermal expansion coefficient between them is commonly at most $10 \times 10^{-6}/°$ C., is preferably at most $8 \times 10^{-6}/°$ C., is more preferably at most $5 \times 10^{-6}/°$ C., but is most preferably at most $2 \times 10^{-6}/°$ C. "Linear thermal expansion coefficient", as described herein, is a common physical property value characteristic of materials.

Combinations of electrically conductive metallic host materials and dielectrics which result in a difference of linear thermal expansion coefficient within the above ranges include:
1: the metallic host material is pure titanium or a titanium alloy, while the dielectric is a thermally sprayed ceramics film
2: the metallic host material is pure titanium or a titanium alloy, while the dielectric is a glass lining
3: the metallic host material is stainless steel, while the dielectric is a thermally sprayed ceramics film
4: the metallic host material is stainless steel, while the dielectric is a glass lining
5: the metallic host material is a composite material of ceramics and iron, while the dielectric is a thermally sprayed film
6: the metallic host material is a composite material of ceramics and iron, while the dielectric is a glass lining
7: the metallic host material is a composite material of ceramics and aluminum, while the dielectric is a thermally sprayed film
8: the metallic host material is a composite material of ceramics and aluminum, while the dielectric is a glass lining In view of the difference in the linear thermal expansion coefficient, preferred are above items 1, 2, and 5-8, of which item 1 is particularly preferred.

In the present invention, based on the above characteristics, titanium or titanium alloys are particularly useful as a metallic host material. By employing titanium or titanium alloys as the metallic host material and by employing the above dielectrics, degradation of electrodes during use, particularly such as cracking, peeling, or releasing is minimized, whereby extended endurance under severe conditions is achievable.

Metallic host materials of the electrodes which are beneficial in the present invention are titanium alloys incorporating at least 70% by weight of titanium or metal titanium. In the present invention, when the content of titanium in titanium alloys or titanium metals is at least 70% by weight, they may be employed without any problem. However, those incorporating at least 80% by weight of titanium are preferred. As titanium alloys or titanium metals which are useful in the present invention, employed may be those which are commonly employed as industrial pure titanium, corrosion resistant titanium, or high-strength titanium. Industrial pure titanium includes TIA, TIB, TIC, and TID. In any of these, iron atoms, carbon atoms, nitrogen atoms, oxygen atoms and hydrogen atoms are very slightly incorporated and the content of titanium is at least 99% by weight. As the corrosion resistant titanium alloys, preferably employed may be T15PB, and other than the above incorporated atoms, lead is incorporated, whereby the content of titanium is at least 98% by weight. Further, as a titanium alloy, preferably employed may be T64, T325, T525 and TA3 which incorporate aluminum, vanadium, or tin other than the above atoms except for lead. The content of titanium of these is 85% by weight. The thermal expansion coefficient of these titanium alloys and metal titanium is low, being about one half of stainless steel, such as AISI316. Consequently, a good combination with the dielectric described below, results, which is applied onto a titanium alloy or titanium metal as a metallic host material, whereby extended use at high temperature is achievable.

On the other hand, a specifically required characteristic is that dielectrics are inorganic compounds of a relative dielectric constant of 6-45. Such dielectrics include alumina, ceramics such as silicon nitride, and glass lining materials such as silicate based glass or borate based glass. Of these, preferred are those prepared by thermal spraying or arranged by glass lining. Dielectrics arranged via thermal spraying of alumina are specifically preferred.

Further, as one of the specifications which endures high electric power as described above, the void ratio of dielectrics is commonly at most 10% by volume, is preferably 8% by volume, but is more preferably 0-5% by volume. It is possible to determine the void ratio of dielectrics via the BET adsorption method and the mercury porosimeter. In the example described below, the void ratio of a flake of the dielectric which covers a metallic host material is determined via the mercury porosimeter, produced by Shimadzu Corp. By decreasing the void ratio of dielectrics, higher durability is realized. Dielectrics which incorporate such voids of a low void ratio may include a high density and high adhesion ceramics thermal sprayed film prepared via the atmospheric plasma thermal spraying method described below. It is preferable to perform a sealing process to further reduce the void ratio.

In the above atmospheric plasma thermal spraying method, the following technology is employed. Micro-powders such as ceramics or wires are placed in a plasma heat source, and converted to minute particles in a molten or semi-molten state, which are then sprayed onto a metallic host material to form a film. "Plasma heat source", as described herein, refers to a high temperature plasma gas which is prepared in such a manner that a molecular gas is heated to high temperature, dissociated to atoms, and energy is further provided until electrons are released. The injection speed of the above plasma gas is high, and thermal spraying materials collide with metallic host materials at a high rate, compared to the conventional arc thermal spraying or flame thermal spraying, whereby it is possible to prepare a film exhibiting high adhesion strength and high density. In more detail, reference may be made to the thermal spraying method, described in JP-A No. 2000-301655, in which a heat shielding film is formed on a member to be exposed to high temperature. By employing this method, it is possible to realize the void ratio of the dielectrics (being a ceramic thermal sprayed film) which are covered as described above.

Further, another preferred specification to endure high electric power is that the thickness of dielectrics is 0.5%-2 mm. Variation of the above thickness is preferably at most 5%, is more preferably at most 3%, but is most preferably at most 1%.

In order to further reduce the void ratio of dielectrics, it is preferable that the thermal sprayed film prepared as above is subjected to a sealing treatment via inorganic compounds. Metal oxides are preferred as the above inorganic compounds, and those which incorporate silicon oxide ($SiO_x$) as a main component are particularly preferred.

Inorganic compounds for the sealing treatment are preferably those which are formed while hardened via a sol-gel reaction. When inorganic compounds for the sealing treatment are composed of metal oxides as the main component, metal alkoxides are applied onto the above ceramic thermal sprayed film, followed by hardening via the sol-gel reaction.

When inorganic compounds are composed of silica as a main component, it is preferable to employ alkoxysilane as the liquid sealing composition.

In order to accelerate the sol-gel reaction, it is preferable to employ an energy treatment. Energy treatments include thermal hardening (preferably at most 200° C.) as well as ultraviolet ray exposure. Further, when a diluted liquid sealing composition is subjected to repeated coating and hardening several times, inorganic performance is further enhanced, whereby it is possible to prepare a dense electrode which results in no deterioration.

When a sealing treatment is corrode out in which hardening is carried out via the sol-gel reaction after coating the ceramics thermal sprayed film with metal alkoxide of the dielectric covered electrode according to the present invention as a liquid sealing composition, the content of metal oxides after hardening is preferably at least 60 mol %. When alkoxysilane is employed as a metal alkoxide of the liquid sealing composition, the content of $SiO_x$ (in which x is at most 2) after hardening is preferably at least 60 mol %. The content of $SiO_x$ after hardening is determined as follows. The cross-section of a dielectric layer is analyzed via XPS (X-ray photoelectron spectroscopy).

In the electrode according to the thin film forming method of the present invention, in view of realizing the effects described in the present invention, it is preferable that the maximum height ($R_{max}$) of the surface roughness of the side of the electrode, which comes into contact with at least the substrate, is regulated to be at most 10 µm. The above surface roughness is specified by JIS B 0601. The regulated maximum value of the surface roughness is more preferably at most 8 µm, but is most preferably at most 7 µm. By employing a method in which the dielectric surface of the dielectric covered electrode is subjected to a polished finish, it is possible to maintain desired dielectric thickness and the gap between the electrodes, whereby it is possible to stabilize the electric discharge state, minimize distortion and cracking due to difference in thermal contraction and residual stress, realize high accuracy and significantly enhance durability. It is preferable that polished finish of the dielectric surface is applied to at least the side of the dielectric which comes into contact with at least the substrate. Further, the center line mean surface roughness (Ra), specified by JIS B 0601, is preferably at most 0.5 µm, but is more preferably at most 0.1 µm.

In the dielectric covered electrode employed in the present invention, another preferable specification which endures high power is that heat resistant temperature is at least 100° C. The heat resistant temperature is more preferably at least 120° C., but is most preferably at least 150° C., however the upper limit is 500° C. "Heat resistant temperature", as described herein, refers to the highest temperature at which at the voltage employed in the atmospheric pressure plasma processing, no dielectric breakdown occurs and normal discharge is carried out. It is possible to realize the above heat resistant temperature via appropriate combination of the applications of the above ceramics thermal spraying, dielectrics arranged by layer-shaped glass lining in which bubble mixing amount differs, and the means to appropriately select materials which are within the range of the difference in linear heat expansion coefficient of the above metallic host materials and dielectrics.

<<Polarizer Protective Film and Polarizer>>

The moisture-proof cellulose ester film of the present invention, which incorporates a cellulose ester film having on each side of a adhesion layer, a barrier layer and a protective layer, is characterized in its application as a polarizer protective film.

It is possible to prepare polarizers via any of the common methods. It is preferable that the moisture-proof cellulose ester film of the present invention, which has undergone alkali saponification, is adhered to at least one side of the polarizer which has been prepared by immersing polyvinyl alcohol based film into an iodine solution followed by stretching, employing an aqueous completely saponified type polyvinyl alcohol solution. On the other surface, employed may be the moisture-proof cellulose ester film of the present invention, or another polarizer protective film. With regard to the moisture-proof cellulose ester film of the present invention, it is possible to employ, as a polarizer protective film employed on the opposite side, commercial cellulose ester film. Preferably employed examples thereof include KC8UX2M, KC4UX, KC5UX, KC4UY, KC8UY, KC12UR, KC8UY-HA, and KC8UX-RHA (all produced by Konica Minolta Opto, Inc.). Alternately, employed may be, as a polarizer protective film on the other side, films composed of cyclic olefin resins, acryl resins, polyesters, or polycarbonates, other than the cellulose ester film. In this case, since saponification capability is low, it is preferable that adhesion to a polarizer is carried out via an appropriate adhesion layer.

In the polarizer of the present invention, the moisture-proof cellulose ester film of the present invention is employed on at least one side of a polarizer as a polarizer protective film. In this case, it is preferable that the delayed phase axis of the moisture-proof cellulose ester of the present invention is arranged to be substantially parallel or perpendicular to the absorption axis of the polarizer.

As a polarizer on one side which, is arranged to interpose a liquid crystal cell which is in a lateral electric field switching mode type, it is preferable that the moisture-proof cellulose ester film of the present invention is arranged on the liquid crystal display cell side.

Polarizers which are preferably employed in the polarizer of the present invention include polyvinyl alcohol based polarizing films, which include one which is prepared by dying polyvinyl alcohol based film with iodine, and an other which is dyed with dichroic dyes. As the polyvinyl alcohol based film, preferably employed is a modified polyvinyl alcohol based film modified with ethylene. Polarizers are prepared as follows. Film is produced employing an aqueous polyvinyl alcohol solution and the resulting film is uniaxially stretched and dyed, or dyed and then uniaxially stretched, followed by an endurance treatment, preferably employing boron compounds. The film thickness of polarizers is commonly 5-40 µm, is preferably 5-30 µm, but is most preferably 5-20 µm. A polarizer is formed by allowing one side of the moisture-proof cellulose ester film of the present invention to adhere to the surface of the above polarizer. It is preferable that the adhesion is carried out via an aqueous adhesive agent incorporating completely saponified polyvinyl alcohol as a main component. Further, in the case of resin films other than cellulose ester films, it is possible to carry out adhesion onto the polarizer via an appropriate adhesive layer.

A polarizer is uniaxially stretched (commonly, in the longitudinal direction). Accordingly, when a polarizer is placed in an ambience of high temperature and high humidity, the stretching direction (commonly the longitudinal direction) is subjected to shrinkage, while the perpendicular direction to stretching (commonly the lateral direction) is subjected to elongation. As the thickness of the polarizer protective film decreases, the contraction ratio of the polarizer increases, and the contraction amount in the stretching direction of the polarizer substantially increases. Commonly, the stretching direction of the polarizer is adhered to the polarizer protective film casting direction (the MD direction). Therefore, when the thickness of the polarizer protective film is decreased, it is critical to control the contraction ratio, particularly in the casting direction. Since the moisture-proof cellulose ester film of the present invention exhibits an excellent moisture-proof effect, it is appropriately employed as such a polarizer protective film.

EXAMPLES

The present invention will now be specifically described with reference to examples, however the present invention is not limited thereto. In the examples, "parts" or "%" is employed and refers to parts by weight or % by weight, respectively, unless otherwise specified.

Example 1

Preparation of Moisture Registrant Cellulose Ester Film

Preparation of Sample 1

According to each of the preparation conditions below, formed on both sides of a 40 μm thick cellulose triacetate film (the trade name of KONICA MINOLTA TAC KC4UY, produced by Konica Minolta Opto, Inc.) was a thin film composed of a adhesion layer (thickness: 10 nm), a barrier layer (thickness: 5 nm), and a protective layer (thickness: 50 nm) in the stated order, employing the atmospheric pressure plasma discharge processing apparatus, described in FIG. 2.
(Formation of Adhesion Layer)

| <Mixed Gas Composition for Forming Adhesion layer> | |
| --- | --- |
| Discharge gas: nitrogen gas | 98.85% by volume |
| Thin film forming gas: hexamethyldisiloxane | 0.15% by volume |
| Added gas: hydrogen gas | 1.0% by volume |

<Adhesion Layer Forming Conditions>
First electrode side Power source type: Haiden Laboratory, Inc. 100 kHz (continuous mode) PHF-6 k
  Frequency: 100 kHz
  Output density: 10 W/cm$^2$ (at this time, voltage Vp was 7 kV)
  Electrode temperature: 90° C.
Second electrode side Power source type: Pearl Kogyo Co., Ltd.
  13.56 MHz CF-5000-13M
  Frequency: 13.56 MHz
  Output density: 5 W/cm$^2$ (at this time, voltage Vp was 1 kV)
  Electrode temperature: 90° C.
(Formation of Barrier Layer)

| <Mixed Gas Composition for Forming Barrier Layer> | |
| --- | --- |
| Discharge gas: nitrogen gas | 94.99% by volume |
| Thin film forming gas: tetraethoxysilane | 0.01% by volume |
| Added gas: oxygen gas | 5.0% by volume |

<Barrier Layer Forming Conditions>
First electrode side Power source type: Haiden Laboratory, Inc. 100 kHz (continuous mode) PHF-6 k
  Frequency: 100 kHz
  Output density: 12 W/cm$^2$ (at this time, voltage Vp was 8 kV)
  Electrode temperature: 90° C.
Second electrode side Power source type: Pearl Kogyo Co., Ltd.
  13.56 MHz CF-5000-13M
  Frequency: 13.56 MHz
  Output density: 10 W/cm$^2$ (at this time, voltage Vp was 2 kV)
  Electrode temperature: 90° C.
(Formation of Protective Layer)

| <Mixed Gas Composition for Forming Protective Layer> | |
| --- | --- |
| Discharge gas: nitrogen gas | 94.5% by volume |
| Thin film forming gas: hexamethyldisiloxane | 0.5% by volume |
| Added gas: oxygen gas | 5.0% by volume |

<Protective Layer Forming Conditions>
First electrode side Power source type: Haiden Laboratory, Inc. 100 kHz (continuous mode) PHF-6 k
  Frequency: 100 kHz
  Output density: 10 W/cm$^2$ (at this time, voltage Vp was 7 kV)
  Electrode temperature: 90° C.
Second electrode side Power source type: Pearl Kogyo Co., Ltd.
  13.56 MHz CF-5000-13M
  Frequency: 13.56 MHz
  Output density: 5 W/cm$^2$ (at this time, voltage Vp was 1 kV)
  Electrode temperature: 90° C.

Preparation of Sample 2

Sample 2 was prepared in the same manner as above Example 1, except that the film thickness of each of the constituting layers arranged on both sides of the cellulose triacetate film was changed to the following conditions.
Adhesion layer: 5 nm
Barrier layer: 0.5 nm
Protective layer: 40 nm Preparation of Sample 3

Sample 3 was prepared in the same manner as above Example 1, except that the film thickness of each of the constituting layers arranged on both sides of the cellulose triacetate film was changed to the following conditions.
Adhesion layer: 20 nm
Barrier layer: 1.0 nm
Protective layer: 70 nm Preparation of Sample 4

Sample 4 was prepared in the same manner as above Example 1, except that the forming conditions of the barrier layer was changed as described below, and the adhesion layer (20 nm), the barrier layer (30 nm), and the protective layer (50 nm) were sequentially subjected to thin film formation.
(Formation of Barrier Layer)

| <Mixed Gas Composition for Forming Barrier Layer> | |
| --- | --- |
| Discharge gas: nitrogen gas | 94.97% by volume |
| Thin film forming gas: hexamethyldisiloxane | 0.03% by volume |
| Added gas: oxygen gas | 5.0% by volume |

<Barrier Layer Forming Conditions>
First electrode side Power source-type: Haiden Laboratory, Inc. 100 kHz (continuous-mode) PHF-6 k
  Frequency: 100 kHz
  Output density: 10 W/cm² (at this time, voltage Vp was 7 kV)
  Electrode temperature: 90° C.
Second electrode side Power source type: Pearl Kogyo Co., Ltd.
  13.56 MHz CF-5000-13M
  Frequency: 13.56 MHz
  Output density: 10 W/cm² (at this time, voltage Vp was 2 kV)
  Electrode temperature: 90° C.

Preparation of Sample 5

Comparative Example

Sample 5 was prepared in the same manner as above Sample 1, except that the thickness of the barrier layer was only changed to 50 nm according to the following preparation conditions.
(Formation of Barrier Layer)

| <Mixed Gas Composition for Forming Barrier Layer> | |
|---|---|
| Discharge gas: helium gas | 98.8% by volume |
| Thin film forming gas: hexamethyldisiloxane | 0.2% by volume |
| Added gas: oxygen gas | 1.0% by volume |

<Barrier Layer Forming Conditions>
First electrode side Power source type: Pearl Kogyo Co., Ltd.
  13.56 MHz CF-5000-13M
  Frequency: 13.56 MHz
  Output density: 10 W/cm² (at this time, voltage Vp was 2 kV)
  Electrode temperature: 90° C.
Second electrode side Not used Preparation of Sample 6

Comparative Example

Sample 6 was prepared in the same manner as above Sample 5, except that the thickness of the barrier layer was changed to 5 nm.

Preparation of Sample 7

Comparative Example

Sample 7 was prepared in the same manner as above Sample 4, except that the thickness of each layer was changed as described below.
Adhesion layer: 20 nm
Barrier layer: 50 nm
Protective layer: 20 nm Preparation of Sample 8

Comparative Example

Sample 8 was prepared in the same manner as above Example 1, except that the forming conditions of the adhesion layer and the protective layer were changed as described below, and the adhesion layer (20 nm), the barrier layer (35 nm), and the protective layer (50 nm) were sequentially subjected to thin film formation.
(Formation of Adhesion Layer)

| <Mixed Gas Composition for Forming Adhesion layer> | |
|---|---|
| Discharge gas: helium gas | 98.7% by volume |
| Thin film forming gas: tetraethoxysilane | 0.3% by volume |
| Added gas: hydrogen gas | 1.0% by volume |

<Adhesion layer Forming Conditions>
First electrode side Power source type: Pearl Kogyo Co., Ltd.
  13.56 MHz CF-5000-13M
  Frequency: 13.56 MHz
  output density: 5 W/cm² (at this time, voltage Vp was 1 kV)
  Electrode temperature: 90° C.
Second electrode side not used
(Formation of Protective Layer)

| <Mixed Gas Composition for Forming Protective Layer> | |
|---|---|
| Discharge gas: nitrogen gas | 98.5% by volume |
| Thin film forming gas: hexamethyldisiloxane | 0.5% by volume |
| Added gas: oxygen gas | 1.0% by volume |

<Protective Layer Forming Conditions>
First electrode side Power source type: Pearl Kogyo Co., Ltd.
  13.56 MHz CF-5000-13M
  Frequency: 13.56 MHz
  Output density: 5 W/cm² (at this time, voltage Vp was 1 kV)
  Electrode temperature: 90° C.
Second electrode side not used Preparation of Sample 9

Comparative Example

A 40 μm thick cellulose acetate film (the trade name of KONICA MINOLTA TAC KC4UY, produced by Konica Minolta Opto, Inc.) was mounted in the chamber of the plasma chemical gas phase vapor deposition apparatus, described in JP-A 2002-127294. Subsequently, pressure in the chamber of the chemical gas phase vapor deposition apparatus was reduced to an ultimate vacuum of $4.0 \times 10^{-3}$ Pa via an oil rotary pump and an oil diffusion pump.

Further, prepared as material gases are tetramethoxysilane (TMOS, KBM-04, produced by Shin-Etsu Chemical Co., Ltd.), oxygen gas (at a purity of at least 99.9999%, produced by Taiyo Toyo Sanso Co., Ltd.), and helium gas (at a purity of at least 99.9999%, produced by Taiyo Toyo Sanso Co., Ltd.).

Subsequently, an electrode was arranged adjacent to a coating drum, while facing it, and high-frequency power at a frequency of 40 kHz was applied between the coating drum and the electrode.

Thereafter, TMOS gas, oxygen gas, and helium gas were introduced from the inlet arranged adjacent to the electrode in the chamber. By controlling the opening and closing degree of the valve placed between the vacuum pump and the chamber, pressure in the film forming chamber was maintained at 6.7 Pa, and a adhesion layer, a barrier layer, and a protective layer were formed on the cellulose ester film. The same operation was applied to the rear side, whereby Sample 9 was prepared.

(Formation of Adhesion Layer)
TMOS gas: 500 sccm
Hydrogen gas: 20 sccm
Helium gas: 1,000 sccm
Layer thickness: 10 nm
(Formation of Barrier Layer)
TMOS gas: 50 sccm
Oxygen gas: 50 sccm
Helium gas: 1,000 sccm
Layer thickness: 5 nm
(Formation of Protective Layer)
TMOS gas: 500 sccm
Oxygen gas: 50 sccm
Helium gas: 1,000 sccm
Layer thickness: 50 nm
<<Determination of Characteristic Values of Moisture-Proof Cellulose Ester Film>>
(Determination of Thickness of Each Layer and Total Thickness)

Determination was performed via an X-ray reflectivity method. MXP21 produced by Mac Science Co., Ltd. was employed as a measuring device. Copper was employed as a target of the X-ray source and operation was carried out at 42 kV and 500 mA. A multilayer parabola mirror was employed as an incident monochrometer. An entrance slit of 0.05 mm×5 mm was employed, while a light accepting slit of 0.03 mm×20 mm was employed. Determination was carried out via a 2θ/θ scanning system employing an FT method at a step width of 0-50 and one step of 10 seconds. The resulting reflectivity curve was subjected to curve fitting employing REFLECTIVITY ANALYSIS PROGRAM VER. 1, produced by Mac Science Co., Ltd., and each parameter was obtained so that actual measurement values and the residual sum of square became minimal, and based on each parameter, the thickness (in nm) of each layer and the total layer thickness (in nm) were determined.
(Determination Film Density)

In the same manner as the above determination of the thickness of each layer and the total layer thickness, each parameter was obtained employing MXP21 produced by Mac Science Co., Ltd., and based on each parameter, the film density (in g/cm$^3$) of each layer was obtained.
(Determination of Carbon Content (Atomic Concentration in %))

ESCALAB-200R, produced by VG Scientifics Co., Ltd. was employed as an XPS surface analytical instrument.

Mg was employed as an X-ray anode, and measurements were performed at an output of 600 W (an acceleration voltage of 15 kV and an emission electric current of 40 mA). Energy resolution was set to result in 1.5-1.7 eV when specified by the half value width of a clean Ag3d5/2 peak.

Upon measurement, initially, the range of bond energy of 0-1,100 eV was measured at data downloading intervals of 1.0 eV, and any of the detected elements were obtained.

Subsequently, with regard to all detected atoms except for etching ion species, slow scanning is performed for photoelectron peak which provides the maximum intensity at data downloading intervals of 0.2 eV, whereby spectra of each element were determined.

In order to minimize difference in the computed results of the content ratio due to measuring instruments or computers, the obtained spectra were transferred to COMMON DATA PROCESSING SYSTEM (Ver. 2.3 or the following is preferred), produced by VAMAS-SCA-JAPAN, and subsequently were processed via the software thereof. The content ratio value of carbon which was the analysis targeted element was obtained as atomic concentration (in %).
(Moisture Vapor Transmission (Water Vapor Transmission Rate))

Water vapor transmission rate (g/cm$^2$/day) of each sample, as prepared as above, was determined under conditions of 40° C. and 90% relative humidity, based on JIS K 7129B, employing a water vapor transmission rate meter PERMATRAN-W 3/33 MG Module.

Table 1 shows the results.

TABLE 1

| Sample No. | Closely Adhered Layer | | | Barrier Layer | | | Protective Layer | | | Total Film | | |
|---|---|---|---|---|---|---|---|---|---|---|---|---|
| | Film Thickness (nm) | *1 | Film Density (g/cm$^3$) | Film Thickness (nm) | *1 | Film Density (g/cm$^3$) | Film Thickness (nm) | *1 | Film Density (g/cm$^3$) | Thickness (per side) (nm) | *2 | Remarks |
| 1 | 10 | 4.8 | 1.96 | 5.0 | <0.1 | 2.19 | 50 | 12.3 | 1.88 | 65 | 0.12 | Inv. |
| 2 | 5 | 4.8 | 1.96 | 0.5 | <0.1 | 2.19 | 40 | 12.3 | 1.88 | 45.5 | 14.7 | Inv. |
| 3 | 20 | 4.8 | 1.96 | 1.0 | <0.1 | 2.19 | 70 | 12.3 | 1.88 | 91 | 6.3 | Inv. |
| 4 | 20 | 4.8 | 1.96 | 30 | <0.1 | 2.19 | 50 | 12.3 | 1.88 | 100 | 0.03 | Inv. |
| 5 | — | — | — | 50 | 0.8 | 2.08 | — | — | — | 50 | 23.8 | Comp. |
| 6 | — | — | — | 5.0 | <0.1 | 2.19 | — | — | — | 5 | 0.17 | Comp. |
| 7 | 20 | 4.8 | 1.96 | 50 | <0.1 | 2.16 | 20 | 12.3 | 1.88 | 90 | 0.01 | Comp. |
| 8 | 20 | 11.2 | 2.01 | 35 | <0.1 | 2.19 | 50 | 8.6 | 2.05 | 105 | 0.07 | Comp. |
| 9 | 20 | 7.6 | 1.94 | 30 | <0.1 | 2.12 | 50 | 12.3 | 1.95 | 100 | 62.1 | Comp. |

*1: carbon content (atomic concentration in %),
Inv.: Present Invention,
Comp.: Comparative Example,
*2: Water Vapor Transmission Rate (g/m$^2$/day)

<<Evaluation of Characteristics of Moisture-proof Cellulose Ester Films>>
(Evaluation of Folding Resistance)

The film surface side of each of the prepared samples was wound 20 times onto a 100 mmφ cylinder. Thereafter, each water vapor transmission rate prior to and after winding was determined via the same method as above, and the change of water vapor transmission due to formation of cracking was determined, which was designated as a scale of the folding resistance.

A: the change of water vapor transmission prior to and after winding was less than 5%

B: the change of water vapor transmission prior to and after winding exceeded 5& (resulting in degradation)

(Evaluation of Close Adhesion: (Cross-Cut Adhesion Test))

Each of the prepared samples was subjected to the cross-cut adhesion test, base on JIS K 5400. On the surface of the formed thin film, 11 cut lines at intervals of 1 mm were made in the lateral and longitudinal directions, employing a single-edged laser blade so that the angle of the blade to the surface was held to be 90°, whereby 100 grids of 1 mm square were formed. Commercial cellophane tape was adhered onto the resulting surface and peeled in the vertical direction by holding one side by hand. Subsequently, the ratio of the peeled area to the adhered layer within the peripheral cut line was determined, and evaluated based on the following criteria:
A: the peeled area was less than 5%
B: the peeled are was at least 5%

Table 2 shows the results.

TABLE 2

| Sample No. | Water Vapor Transmission Rate (g/m²/day) | Folding Resistance | Close Adhesion | Remarks |
|---|---|---|---|---|
| 1 | 0.12 | A | A | Present Invention |
| 2 | 14.7 | A | A | Present Invention |
| 3 | 6.3 | A | A | Present Invention |
| 4 | 0.03 | A | A | Present Invention |
| 5 | 23.8 | B | B | Comparative Example |
| 6 | 0.17 | B | B | Comparative Example |
| 7 | 0.01 | B | B | Comparative Example |
| 8 | 0.07 | B | B | Comparative Example |
| 9 | 62.1 | A | A | Comparative Example |

As can clearly be seen from the results described in Table 2, samples which were composed of the layers which satisfied the film characteristic conditions specified in the present invention exhibited excellent moisture-proof effects, and excelled in the folding resistance and the close adhesion, compared to the comparative examples.

Example 2

Preparation of Moisture-Proof Cellulose Ester Films

Preparation of Sample 10

A adhesion layer (10 nm), a barrier layer (5 nm), and a protective layer (50 nm) were sequentially formed on one side of a 40 μm thick cellulose triacetate film (trade name: KONICA MINOLTA TAC KC4UY, produced by Konica Minolta Opto, Inc.) under the following preparing conditions, employing an atmospheric pressure plasma discharge processing apparatus fitted with the electrode prepared as above, while rotating the rotary roller electrode via drive, whereby Sample 10 was prepared.

Preparation of Adhesion Layer

| <Adhesion layer Mixed Gas Composition> | |
|---|---|
| Discharge gas: nitrogen gas | 98.50% by volume |
| Thin film forming gas: hexamethyldisiloxane | 0.5% by volume |
| Added gas: hydrogen gas | 1.0% by volume |

<Adhesion Layer Forming Conditions>
First electrode side Power source type: Haiden Laboratory, Inc. 100 kHz (continuous mode) PHF-6 k
  Frequency 100 kHz
  Output density 10 W/cm² (at this time, voltage Vp was 7 kV)
  Electrode temperature 90° C.
Second electrode side Power source type: Pearl Kogyo Co., Ltd.
  13.56 MHz CF-5000-13M
  Frequency 13.56 MHz
  Output density 5 W/cm² (at this time, voltage Vp was 1 kV)
  Electrode temperature 90° C.
(Formation of Barrier Layer)

| <Barrier Layer Mixed Gas Composition> | |
|---|---|
| Discharge gas: nitrogen gas | 94.99% by volume |
| Thin film forming gas: tetraethoxysilane | 0.01% by volume |
| Added gas: oxygen gas | 5.0% by volume |

<Barrier Layer Forming Conditions>
First electrode side Power source type Haiden Laboratory, Inc. 100 kHz (continuous mode) PHF-6 k
  Frequency 100 kHz
  Output density 12 W/cm² (at this time, voltage Vp was 8 kV)
  Electrode temperature 90° C.
Second electrode side Power source type Pearl Kogyo Co., Ltd. 13.56 MHz CF-5000-13M
  Frequency 13.56 MHz
  Output density 10 W/cm² (at this time, voltage Vp was 2 kV)
  Electrode temperature 90° C.
(Formation of Protective Layer)

| <Protective Layer Mixed Gas Composition> | |
|---|---|
| Discharge gas: nitrogen gas | 94.7% by volume |
| Thin film forming gas: hexamethyldisiloxane | 0.3% by volume |
| Added gas: oxygen gas | 5.0% by volume |

<Protective Layer Forming Conditions>
First electrode side Power source type: Haiden Laboratory, Inc. 100 kHz (continuous mode) PHF-6 k
  Frequency 100 kHz
  Output density 10 W/cm² (at this time, voltage Vp was 7 kV)
  Electrode temperature 90° C.
Second electrode side Power source type Pearl Kogyo Co., Ltd.
  13.56 MHz CF-5000-13M
  Frequency 13.56 MHz
  Output density 5 W/cm² (at this time, voltage Vp was 1 kV)
  Electrode temperature 90° C.

Preparation of Sample 11

Sample 11 was prepared in the same manner as above Sample 10, except that barrier layer forming conditions were changed as below.

Preparation of Barrier Layer

| <Barrier Layer Mixed Gas Composition> | |
|---|---|
| Discharge gas: nitrogen gas | 94.95% by volume |
| Thin film forming gas: tetraethoxysilane | 0.05% by volume |
| Added gas: oxygen gas | 5.0% by volume |

<Barrier Layer Forming Conditions>
First electrode side Power source type Haiden Laboratory, Inc. 100 kHz (continuous mode) PHF-6 k
Frequency 100 kHz
Output density 12 W/cm$^2$ (at this time, voltage Vp was 8 kV)
Electrode temperature 90° C.
Second electrode side Power source type Pearl Kogyo Co., Ltd. 13.56 MHz CF-5000-13M
Frequency 13.56 MHz
Output density 10 W/cm$^2$ (at this time, voltage Vp was 2 kV)
Electrode temperature 90° C.

Preparation of Sample 12

Sample 12 was prepared in the same manner as above Sample 10, except that barrier layer forming conditions were changed as below.

Preparation of Barrier Layer

| <Barrier Layer Mixed Gas Composition> | |
|---|---|
| Discharge gas: nitrogen gas | 94.95% by volume |
| Thin film forming gas: tetraethoxysilane | 0.05% by volume |
| Added gas: oxygen gas | 5.0% by volume |

<Barrier Layer Forming Conditions>
First electrode side Power source type Haiden Laboratory, Inc. 100 kHz (continuous mode) PHF-6 k
Frequency 100 kHz
Output density 11 W/cm$^2$ (at this time, voltage Vp was 7.5 kV)
Electrode temperature 90° C.
Second electrode side Power source type Pearl Kogyo Co., Ltd. 13.56 MHz CF-5000-13M
Frequency 13.56 MHz
Output density 10 W/cm$^2$ (at this time, voltage Vp was 2 kV)
Electrode temperature 90° C.

Preparation of Sample 13

Comparative Example

Sample 13 was prepared in the same manner as above Sample 10, except that barrier layer forming conditions were changed as below.

Preparation of Barrier Layer

| <Barrier Layer Mixed Gas Composition> | |
|---|---|
| Discharge gas: nitrogen gas | 94.90% by volume |
| Thin film forming gas: tetraethoxysilane | 0.10% by volume |
| Added gas: oxygen gas | 5.0% by volume |

<Barrier Layer Forming Conditions>
First electrode side Power source type Haiden Laboratory, Inc. 100 kHz (continuous mode) PHF-6 k
Frequency 100 kHz
Output density 10 W/cm$^2$ (at this time, voltage Vp was 7 kV)
Electrode temperature 90° C.
Second electrode side Power source type Pearl Kogyo Co., Ltd. 13.56 MHz CF-5000-13M
Frequency 13.56 MHz
Output density 5 W/cm$^2$ (at this time, voltage Vp was 1 kV)
Electrode temperature 90° C.

Preparation of Sample 14

Comparative Example

Sample 14 was prepared in the same manner as above Sample 10, except that barrier layer forming conditions were changed as below.

Preparation of Barrier Layer

| <Barrier Layer Mixed Gas Composition> | |
|---|---|
| Discharge gas: nitrogen gas | 94.90% by volume |
| Thin film forming gas: tetraethoxysilane | 0.10% by volume |
| Added gas: oxygen gas | 5.0% by volume |

<Barrier Layer Forming Conditions>
First electrode side Power source type Haiden Laboratory, Inc. 100 kHz (continuous mode) PHF-6 k
Frequency 100 kHz
Output density 10 W/cm$^2$ (at this time, voltage Vp was 7 kV)
Electrode temperature 90° C.
Second electrode side Not used (used as a ground)

Preparation of Sample 15

Comparative Example

Sample 15 was prepared in the same manner as above Sample 13, except that the layer configuration was changed to a adhesion layer (20 nm), a barrier layer 30 nm), and a protective layer (50 nm).

Preparation of Sample 16

Sample 16 was prepared in the same manner as above Sample 10, except that the barrier layer was formed as described below.
<Barrier Layer Forming Conditions>
A substrate was placed in a sputtering apparatus, followed by pressure reduction to 1.3 mPa. Thereafter, a mixed gas of Ar/O$_2$=70/30 was introduced so that the ambient pressure reached 0.22 Pa. Silicon was employed as a sputtering target, and DC sputtering was carried out at an input power density of 1 W/cm$^2$ and a substrate temperature of room temperature, whereby a 30 nm thick barrier layer composed of SiO$_x$ was formed.

<<Determination of Characteristic Values of Moisture-Proof Cellulose Ester Film>>

The thickness of each layer and the total layer, the film density, the carbon content (atomic concentration %), and the moisture transmittance (water vapor transmission rate) of each moisture-proof cellulose ester film, prepared as above, were determined via the methods described in Example 1. Table 3 shows the results.

TABLE 3

| Sample No. | Closely Adhered Layer Film Thickness (nm) | *1 | Closely Adhered Layer Film Density (g/cm³) | Barrier Layer Film Thickness (nm) | *1 | Barrier Layer Film Density (g/cm³) | Protective Layer Film Thickness (nm) | *1 | Protective Layer Film Density (g/cm³) | Total Film Thickness (per side) (nm) | *2 | Remarks |
|---|---|---|---|---|---|---|---|---|---|---|---|---|
| 10 | 10 | 27.7 | 1.88 | 5.0 | <0.1 | 2.20 | 50 | 2.8 | 1.98 | 65 | 0.22 | Inv. |
| 11 | 10 | 27.7 | 1.88 | 5.0 | <0.1 | 2.18 | 50 | 2.8 | 1.98 | 65 | 3.82 | Inv. |
| 12 | 10 | 27.7 | 1.88 | 5.0 | <0.1 | 2.16 | 50 | 2.8 | 1.98 | 65 | 43.4 | Inv. |
| 13 | 10 | 27.7 | 1.88 | 5.0 | <0.1 | 2.14 | 50 | 2.8 | 1.98 | 65 | >100 | Comp. |
| 14 | 10 | 27.7 | 1.88 | 5.0 | <0.1 | 2.10 | 50 | 2.8 | 1.98 | 65 | >100 | Comp. |
| 15 | 10 | 27.7 | 1.88 | 30 | <0.1 | 2.14 | 50 | 2.8 | 1.98 | 100 | 81.4 | Comp. |
| 16 | 10 | 27.7 | 1.88 | 30 | <0.1 | 2.32 | 50 | 2.8 | 1.98 | 100 | 0.92 | Inv. |

*1: carbon content (atomic concentration in %),
Inv.: Present Invention,
Comp.: Comparative Example,
*2: Water Vapor Transmission Rate (g/m²/day)

<<Evaluation of Characteristics of Moisture-Proof Cellulose Ester Films>>

Evaluation of folding resistance and close adhesion (a cross-cut adhesion test) of each moisture-proof cellulose ester film, prepared as above, was carried out via the same methods described in Example 1. Table 4 shows the results.

TABLE 4

| Sample No. | Water Vapor Transmission Rate (g/m²/day) | Folding Resistance | Close Adhesion | Remarks |
|---|---|---|---|---|
| 10 | 0.22 | A | A | Present Invention |
| 11 | 3.82 | A | A | Present Invention |
| 12 | 43.4 | A | A | Present Invention |
| 13 | >100 | A | A | Comparative Example |
| 14 | >100 | A | A | Comparative Example |
| 15 | 81.4 | A | A | Comparative Example |
| 16 | 0.92 | A | A | Present Invention |

As can clearly be seen from the results described in Table 4, samples which were composed of the layers which satisfied the film characteristic conditions specified in the present invention exhibited excellent moisture-proof effects, and excelled in the folding resistance and the close adhesion, compared to the comparative examples.

Example 3

Preparation of Polarizers

A 50 μm thick polyvinyl alcohol film was uniaxially stretched (at 110° C. and a stretching factor of 5). The resulting film was immersed into an aqueous solution at a composition ratio of 0.075 g iodine, 6 g potassium iodide, and 100 g water for 60 seconds, and then immersed into an aqueous solution at a composition ratio of 6 g potassium iodide, 7.5 g boric acid, and 100 g water at 68° C., followed by washing and drying, whereby a polarizer was prepared.

Subsequently, Polarizers 1-16 were prepared according to following Processes 1-5:
(Process 1)
Each of Samples 1-9 which were moisture-proof cellulose ester films prepared in Examples 1 and 2 as a polarizer protective film was immersed into a 2 mol/L sodium hydroxide solution at 60° C. for 90 seconds, followed by washing and drying, whereby the side to be adhered to a polarizer was saponified.

Commercial cellulose ester film KC8UX2M (produced by Konica Minolta Opto, Inc.) was also saponified to be employed as a polarizer protective film on the opposite side.
(Process 2)

The above polarizer was immersed for 1-2 seconds into a polyvinyl alcohol adhesive agent at 2% solid by weight in a tank.
(Process 3)

The adhesive agent adhered to the polarizer in Process 2 was removed via gentle wiping. The resulting polarizer was placed on the saponified side of each sample processed in Process 1, which was prepared in Example 1. Further, as a polarizer protective film on the opposite side, lamination was carried out so that the saponified side of the commercial cellulose ester film KC8UX2M processed in Process 1 was brought into contact with the polarizer.
(Process 4)

A polarizer prepared by laminating each sample and the polarizer in Process 3 was subjected to adhesion at a pressure of 20-30 N/cm² and a conveying rate of approximately 2 m/minute.
(Process 5)

The polarizer prepared via Process 4 was dried in a dryer at 80° C. for 2 minutes, whereby Polarizers 1-16 were prepared.
<<Preparation of Liquid Crystal Display Devices>>

A liquid crystal panel to evaluate visibility was prepared as follows.

Liquid crystal television Wooo W-17LC50, produced by Hitachi, Ltd. was utilized. The previously adhered polarizers on both sides were peeled off. Each of Polarizers 1-16, prepared as above, was adhered to the glass surface of the liquid crystal cell (VA type). Adhesion was carried out as follows. The surface of each of Samples 1-16 which were moisture-proof cellulose ester films was on the liquid cell side. Further, the absorption axis was directed to the same direction as the previously adhered polarizer. Thus, Liquid Crystal Display Devices 1-16 were prepared.
<<Evaluation of Liquid Crystal Display Devices>>

Each of the liquid crystal liquid display devices, prepared as above, was allowed to stand in an ambience of 60° C. and 90% relative humidity for 300 hours, and the ambience was returned to 23° C. and 55% relative humidity. Subsequently, the resulting display device was put in operation, and visibility was evaluated. As a result, it was possible to confirm that the liquid crystal display devices employing the moisture-proof cellulose ester film of the present invention exhibited high contrast and excelled in non-uniform luminance resistance and light leakage resistance.

What is claimed is:

1. A moisture-proof cellulose ester film comprising a cellulose ester film and deposited on at least one side thereof in the following order,
one or more adhesion layers each having a carbon content in terms of atomic concentration from 1 to 40% and comprising an inorganic compound as a main component,
one or more barrier layers each having a carbon content in terms of atomic concentration of 0.1% or lower, comprising silicon oxide as a main component, and having a film density from 2.16 to 2.60, and
one or more protective layers each having a carbon content in terms of atomic concentration from 1 to 40% and comprising an inorganic compound as a main component,
wherein one of the barrier layers on one side of the cellulose film has a thickness from 0.1 to 30 nm.

2. The moisture-proof cellulose ester film of claim 1, having a degree of a moisture permeation from 0.01 to 50 g/m$^2$/day.

3. The moisture-proof cellulose ester film of claim 1, wherein the one or more barrier layers are provided by a thin film forming method on the cellulose ester film, the method comprising: supplying gas comprising a thin layer forming gas and discharging the gas in a discharge space under atmospheric pressure or near atmospheric pressure, exciting the gas by supplying a high frequency electric field in the discharge space, and exposing the cellulose film to the excited gas.

4. The moisture-proof cellulose ester film of claim 3, wherein the discharging gas is a nitrogen gas, and wherein the high frequency electric field comprises a first high frequency electric field which is overlapped with a second high frequency electric field which is applied on the discharge space,
a frequency $\omega 2$ of the second high frequency electric field is higher than a frequency $\omega 1$ of the first high frequency electric field,
a relationship among a strength of the first high frequency electric field V1, a strength of the second high frequency electric field V2 and a strength of an electric field starting discharge IV satisfies the following: V1≧IV>V2 or V1>IV≧V2, and
an output density of the second high frequency electric field is more than 1 W/cm$^2$.

5. The moisture-proof cellulose ester film of claim 1, wherein one of the adhesion layers has a silicon oxide as a main component, and a density of one of the adhesion layers is from 1.7 to 2.0.

6. The moisture-proof cellulose ester film of claim 1, wherein one or more adhesion layers are provided by a thin film forming method on the cellulose ester film, the method comprising: supplying a gas comprising a thin layer forming gas and discharging the gas in a discharge space under atmospheric pressure or near atmospheric pressure, exciting the gas by supplying a high frequency electric field in the discharge space, and exposing the cellulose film to the excited gas.

7. The moisture-proof cellulose ester film of claim 6, wherein the discharging gas is a nitrogen gas, and wherein the high frequency electric field comprises a first high frequency electric field which is overlapped with a second high frequency electric field which is applied on the discharge space,
a frequency $\omega 2$ of the second high frequency electric field is higher than a frequency $\omega 1$ of the first high frequency electric field,
a relationship among a strength of the first high frequency electric field V1, a strength of the second high frequency electric field V2 and a strength of an electric field starting discharge IV satisfies the following: V1≧IV>V2 or V1>IV≧V2, and
an output density of the second high frequency electric field is more than 1 W/cm$^2$.

8. The moisture-proof cellulose ester film of claim 1, wherein one of the protective layers has a silicon oxide as a main component, and a density of one of the protective layers is from 1.7 to 2.0.

9. The moisture-proof cellulose ester film of claim 1, wherein the one or more protective layers are provided by a thin film forming method on the cellulose ester film, the method comprising: supplying gas comprising a thin layer forming gas and discharging the gas in a discharge space under atmospheric pressure or near atmospheric pressure, exciting the gas by supplying a high frequency electric field in the discharge space, and exposing the cellulose film to the excited gas.

10. The moisture-proof cellulose ester film of claim 9, wherein the discharging gas is a nitrogen gas, and wherein the high frequency electric field comprises a first high frequency electric field which is overlapped with a second high frequency electric field which is applied on the discharge space,
a frequency $\omega 2$ of the second high frequency electric field is higher than a frequency $\omega 1$ of the first high frequency electric field,
a relationship among a strength of the first high frequency electric field V1, a strength of the second high frequency electric field V2 and a strength of an electric field starting discharge IV satisfies the following: V1≧IV>V2 or V1>IV≧V2, and
an output density of the second high frequency electric field is more than 1 W/cm$^2$.

11. The moisture-proof cellulose ester film of claim 1, wherein one or more of the barrier layers on one side of the cellulose film has a thickness from 0.1 to 5.0 nm and a degree of the moisture permeation from 0.1 to 50 g/m$^2$/day.

12. The moisture-proof cellulose ester film of claim 1, wherein the total thickness of the layers on one side of the cellulose film is from 1 to 100 nm.

13. The moisture-proof cellulose ester film of claim 1, wherein the one or more adhesion layers, the one or more barrier layers and the one or more protective layers are on both sides of the cellulose film.

14. A protective film for a polarizing plate comprising the moisture-proof cellulose ester film of claim 13.

15. A polarizing plate comprising the protective film for the polarizing plate of claim 14.

16. The moisture-proof cellulose ester film of claim 1, wherein the one or more adhesion layers, the one or more barrier layers, and the one or more protective layers are continuously formed while the cellulose ester film is unwound from a long roll.

* * * * *